US012584083B2

(12) United States Patent
Tokushima et al.

(10) Patent No.: US 12,584,083 B2
(45) Date of Patent: Mar. 24, 2026

(54) SURFACE TREATMENT COMPOSITION, SURFACE TREATMENT METHOD, AND METHOD FOR PRODUCING SEMICONDUCTOR SUBSTRATE

(71) Applicant: FUJIMI INCORPORATED, Kiyosu (JP)

(72) Inventors: Hideyuki Tokushima, Kiyosu (JP); Tsutomu Yoshino, Kiyosu (JP)

(73) Assignee: FUJIMI INCORPORATED, Kiyosu (JP)

(*) Notice: Subject to any disclaimer, the term of this patent is extended or adjusted under 35 U.S.C. 154(b) by 219 days.

(21) Appl. No.: 18/372,351

(22) Filed: Sep. 25, 2023

(65) Prior Publication Data

US 2024/0124810 A1 Apr. 18, 2024

(30) Foreign Application Priority Data

Sep. 29, 2022 (JP) ................................ 2022-155743
Mar. 29, 2023 (JP) ................................ 2023-052681

(51) Int. Cl.

| | |
|---|---|
| ***C11D 7/32*** | (2006.01) |
| ***C11D 7/04*** | (2006.01) |
| ***C11D 7/26*** | (2006.01) |
| ***H10P 52/40*** | (2026.01) |

(52) U.S. Cl.

CPC .............. *C11D 7/3281* (2013.01); *C11D 7/04* (2013.01); *C11D 7/265* (2013.01); *C11D 7/3263* (2013.01); *H10P 52/402* (2026.01); *C11D 2111/22* (2024.01)

(58) Field of Classification Search

CPC ......... C11D 7/3281; C11D 7/04; C11D 7/265; C11D 7/3263; C11D 2111/22; C11D 3/2079; C11D 3/28; C11D 3/3753; C11D 3/3776; C11D 11/00; C11D 3/33; C11D 3/37; C11D 7/3254; H01L 21/30625; H01L 21/02074; H01L 21/3212

See application file for complete search history.

(56) References Cited

U.S. PATENT DOCUMENTS 5,962,383 A * 10/1999 Doyel .................. C11D 7/3209 134/42
10,144,907 B2 * 12/2018 Yokota ................... C23G 5/028
2007/0219104 A1 * 9/2007 Grumbine ............ C09K 3/1463 134/42
2012/0283163 A1 * 11/2012 Barnes ..................... C11D 3/33 510/175
2016/0075971 A1 * 3/2016 Liu ................... H01L 21/02074 510/175
2016/0122696 A1 * 5/2016 Liu ...................... C11D 3/2072 257/798
2016/0340620 A1 * 11/2016 Sun .......................... C11D 3/30
2016/0376532 A1 * 12/2016 Heo ......................... C11D 3/28 510/175
2017/0298253 A1 * 10/2017 Ishida ...................... C09G 1/02
2018/0037852 A1 * 2/2018 Thomas ............... C11D 3/0073
2018/0051237 A1 * 2/2018 Seino ...................... C11D 7/261
2018/0204736 A1 * 7/2018 White ................. H01L 21/3212
2020/0035485 A1 * 1/2020 Chen .................... C11D 3/0073
2020/0102476 A1 * 4/2020 Gan .................... H01L 21/3212
2020/0199500 A1 * 6/2020 White .................... C09K 13/00
2021/0005473 A1 * 1/2021 Kamimura ............... C09G 1/02
2021/0301405 A1 * 9/2021 Shi ...................... H01L 21/3212
2021/0395645 A1 * 12/2021 Kamimura ......... C11D 17/0008
2022/0106541 A1 * 4/2022 Thomas ................... C11D 3/33

FOREIGN PATENT DOCUMENTS

JP 2015-189899 A 11/2015
WO WO-2013138278 A1 * 9/2013 .......... C11D 7/3281

* cited by examiner

*Primary Examiner* — Binh X Tran
*Assistant Examiner* — Christopher Remavege
(74) *Attorney, Agent, or Firm* — Foley & Lardner LLP

(57) ABSTRACT

Provided is a means for sufficiently removing residues remaining on the surface of a polished object and reducing the surface roughness of the polished object. The present invention relates to a surface treatment composition containing components (A) to (C), and having pH of more than 7.0:

the component (A): a cyclic amine compound having a nitrogen-containing non-aromatic heterocyclic ring, the component (B): a nonionic polymer, the component (C): a buffer represented by a formula: $A\text{-}COO^{-}NH_4^{+}$ wherein A is an alkyl group having from 1 to 10 carbon atoms, or a phenyl group.

16 Claims, No Drawings

SURFACE TREATMENT COMPOSITION, SURFACE TREATMENT METHOD, AND METHOD FOR PRODUCING SEMICONDUCTOR SUBSTRATE

CROSS-REFERENCE TO RELATED APPLICATIONS

The entire disclosures of Japanese Patent Application No. 2022-155743 filed on Sep. 29, 2022 and Japanese Patent Application No. 2023-052681 filed on Mar. 29, 2023, are incorporated herein by reference in its entirety.

BACKGROUND

1. Technical Field

The present invention relates to a surface treatment composition, a surface treatment method, and a method for producing a semiconductor substrate.

2. Description of Related Arts

In recent years, a so-called chemical mechanical polishing (CMP) technique for physically polishing and flattening a semiconductor substrate in producing a device have been used in association with multilayer wiring on a surface of a semiconductor substrate. CMP is a method of flattening a surface of an object to be polished (polishing target) such as a semiconductor substrate, using a polishing composition (slurry) containing abrasive grains such as of silica, alumina, and ceria, an anticorrosive agent, a surfactant, and the like. The object to be polished (polishing target) is a wiring, a plug, and the like made of silicon, polysilicon, silicon oxide, silicon nitride, metal, and the like.

A large amount of impurities (also referred to as foreign substances or residues) remain on a surface of a semiconductor substrate after CMP procedure. The impurities include abrasive grains, a metal, an anticorrosive agent, and an organic substance such as a surfactant, which are derived from the polishing composition used in CMP; a silicon-containing material and a metal, which are generated by polishing a silicon-containing material, a metal wiring, a plug, or the like as an object to be polished; an organic substance such as pad debris generated from various pads; and the like.

Contamination of a surface of a semiconductor substrate with these impurities would adversely affect electrical characteristics of the semiconductor, and reduce reliability of the device. Therefore, it is desirable to introduce a cleaning step after the CMP step to remove these impurities from the surface of the semiconductor substrate.

As such a cleaning composition, for example, JP 2015-189899 A (corresponding to US 2017/0175053 A1, the same shall apply hereinafter) discloses a polishing composition containing: an organic compound containing a specific atom and having a molecular weight of 100 or more; a pH adjusting agent; and 0 to 1 mass % of abrasive grains.

SUMMARY

According to the polishing composition disclosed in JP 2015-189899 A, impurities remaining on the surface of an object to be polished after CMP can be sufficiently removed. However, with an increase in quality required for the surface roughness of the semiconductor substrate, a technique capable of not only sufficiently removing foreign substances (residues) on the surface of the semiconductor substrate but also reducing the surface roughness is required.

Therefore, the present invention has been made in view of the above circumstances, and an object thereof is to provide a means capable of sufficiently removing residues remaining on a surface of a polished object, and reducing the surface roughness of a polished object.

The present inventors have intensively studied to solve the above problems. As a result, the present inventors have found that the above problems can be solved by an alkaline surface treatment composition containing a cyclic amine compound having a nitrogen-containing non-aromatic heterocyclic ring; a nonionic polymer; and ammonium monocarboxylate acting as a buffer, and have completed the present invention.

That is, an embodiment for achieving the above object is a surface treatment composition, containing components (A) to (C) below, and having pH of more than 7.0:

the component (A): a cyclic amine compound having a nitrogen-containing non-aromatic heterocyclic ring, the component (B): a nonionic polymer, the component (C): a buffer represented by a formula: $A\text{-}COO^{-}NH_4^{+}$ wherein A is an alkyl group having from 1 to 10 carbon atoms, or a phenyl group.

DETAILED DESCRIPTION

Details of the invention will be described below. The present invention is not limited to the following embodiments, and various modifications can be made within the scope of the appended claims. In addition, the embodiments described in the present description can be other embodiments by arbitrary combination. The embodiments described in the present description can be other embodiments by arbitrary combination.

Throughout the description, unless particularly stated otherwise, any expression in a singular form should be understood to encompass the concept of its plural form. Therefore, unless particularly stated otherwise, the article specifying a single form (for example, "a", "an", "the", and the like in the case of English language) should be understood to encompass the concept of its plural form. Further, unless particularly stated otherwise, any term used in the present description should be understood as a term that is used to have the meaning conventionally used in the relevant technical field. Therefore, unless defined otherwise, all the technical terms and scientific terms used in the present description have the same meaning as generally understood by a person ordinarily skilled in the art to which the present invention is pertained. If there is any conflict in meaning, the present description (including the definitions) takes priority.

An embodiment of the present invention is to provide a surface treatment composition, which includes components (A) to (C), in which a pH of the composition is more than 7.0:

the component (A): a cyclic amine compound having a nitrogen-containing non-aromatic heterocyclic ring, the component (B): a nonionic polymer, the component (C): a buffer represented by a formula: $A\text{-}COO^{-}NH_4^{+}$ wherein A is an alkyl group having from 1 to 10 carbon atoms, or a phenyl group.

Hereinafter, the surface treatment composition having the above configuration may also be referred to as "surface treatment composition according to the present invention" or "surface treatment composition according to an embodiment of the present invention".

With the surface treatment composition according to an embodiment of the present invention, residues (for example, abrasive grain residues and organic residues) remaining on a surface of a polished object (particularly, a polished substrate having a silicon-silicon bond) can be sufficiently removed. In addition, the surface roughness of a polished object (particularly, a polished substrate having a silicon-silicon bond) can be reduced.

The present inventors presume a mechanism in which by such a configuration, residues on a surface of a polished object can be removed, and further, the surface roughness of a polished object can be reduced, as follows.

The surface treatment composition according to the present invention contains the specific components (A) to (C). Among these components, since the component (A) has a non-aromatic heterocyclic ring containing a nitrogen atom, it is considered that the component (A) is relatively easily adsorbed to a surface of a polished object (particularly, a polished substrate having a silicon-silicon bond). Then, the component (A) is adsorbed to a surface of a polished object, nucleophilically attacks atoms constituting the polished object and extends a bond (particularly, a silicon-silicon bond) formed by the atoms, whereby the bond is easily cut. As a result, it is presumed that etching of the surface of the polished object is promoted, and the surface of the polished object is peeled off by the etching, and at the same time, residues are removed, so that residues can be reduced.

Here, the present inventors have found that, for example, etching of a surface can be promoted by increasing pH of a surface treatment composition using ammonia or the like (that is, setting an alkaline condition), but there is a problem that the surface roughness of a polished object increases.

In view of such a problem, it is considered that the component (A) is adsorbed to a surface of a polished object (particularly, a polished substrate having a silicon-silicon bond) as described above, and acts like a so-called protective film to promote uniform etching on the surface (suppress local etching), thus contributing to reduction in surface roughness. That is, it is presumed that etching is uniformly promoted on a surface of a polished object due to the component (A), so that the surface roughness can be reduced.

In addition, it is presumed that ammonium monocarboxylate (particularly, monocarboxylic acid anion contained in the component (C)) contained as the component (C) interacts with a cyclic amine compound having a nitrogen-containing non-aromatic heterocyclic ring as the component (A), thereby promoting adsorption of the component (A) to a surface of a polished object (particularly, a polished substrate having a silicon-silicon bond). Therefore, when a surface treatment composition does not contain the component (C), the component (A) cannot be sufficiently adsorbed to a surface of a polished object, so that the above effect(s) cannot be obtained, and reduction in residues and surface roughness cannot be achieved (Comparative Examples 10 and 11 described later).

Further, it is considered that the component (B) is adsorbed to a surface of a polished object similarly to the component (A) and acts like a protective film, and further promotes uniform etching. Therefore, the surface treatment composition according to the present invention is excellent in the effect of reducing the surface roughness by containing not only the component (A) but also the component (B). In addition, the component (B) improves the wettability of a surface of a polished object and makes it easy to form a water molecule film on the surface. Therefore, not only the adhesion of hydrophobic organic residues to a surface of a polished object can be suppressed, but also re-adhesion of organic residues can also be prevented. Therefore, with the surface treatment composition according to the present invention, residues can be efficiently removed.

As described above, according to the present invention, residues remaining on a surface of a polished object can be sufficiently removed, and the surface roughness of a polished object can be reduced.

Note that the above mechanism is based on speculation, and the present invention should not be limited to the above mechanism at all.

Hereinafter, embodiments of the present invention will be described in detail, but the present invention is not limited only to the following embodiments, and various modifications can be made within the scope of claims. In addition, the embodiments described in the present description can be other embodiments by arbitrary combination. In the present description, unless otherwise noted, operations and measurements of physical properties and the like are performed under the conditions of room temperature (20° C. or higher and 25° C. or lower)/relative humidity of 40% RH or more and 50% RH or less. In addition, "X and/or Y" means to include each of X and Y and a combination thereof.

[Residue(s)]

As used herein, the term "residue" represents a foreign substance(s) adhered to a surface of a polished object. Examples of the residue, although not particularly limited thereto, include residues derived from an object to be polished, organic residues described later, particle residues derived from abrasive grains (abrasive grain residues) contained in a polishing composition, residues including components other than the particle residues and the organic residues, other residues such as a mixture of the particle residues and the organic residues, and the like.

A total number of residues represents a total number of all residues regardless of the type of the residue. The total number of residues can be measured with a wafer defect inspection apparatus. The number of residues represents a total number of specific residues. A method for measuring the number of residues will be described in detail in Examples described later.

As used herein, the term "organic residue" represents a component including an organic substance such as an organic low molecular weight compound or polymer compound, an organic salt or the like, among foreign substances adhered to a surface of a polished object (object to be subjected to surface treatment).

Examples of the organic residue adhered to a polished object may include pad debris generated from a pad used in a polishing step or a rinse polishing step described later, components derived from an additive(s) contained in a polishing composition used in a polishing step or a surface treatment composition used in a rinse polishing step, and the like.

Since the organic residue and other foreign substances are greatly different in color and shape, it is possible to visually determine whether or not the foreign substance is an organic residue by scanning electron microscopy (SEM) observation. Further, it is also possible to determine whether or not the foreign substance is an organic residue by elemental analysis by energy dispersive X-ray spectroscopy (EDX) as necessary. The number of organic residues can be measured through a wafer defect inspection apparatus and SEM or EDX elemental analysis.

[Polished Object]

As used herein, the term "polished object" means a polished object after being polished in a polishing step. The polishing step is not particularly limited, but is preferably a CMP step.

A material contained in the polished object according to an embodiment of the present invention is not particularly limited, but a Si-based material is preferable from the viewpoint that sufficient etching is promoted by adsorption of the component (A) and the effect(s) of the present invention is easily obtained. Examples of the Si-based material may include a material containing a silicon-silicon bond (silicon material), a material containing a nitrogen-silicon bond, a material containing an oxygen-silicon bond, and the like. A polished object may be made of a plurality of materials among the above materials.

Among these materials, the material contained in a polished object is preferably a material containing a silicon-silicon bond (silicon material) because the effect(s) of the surface treatment composition according to an embodiment of the present invention is more remarkably obtained. That is, the surface treatment composition according to an embodiment of the present invention is preferably used for surface treatment of a substrate having a surface made of a material containing a silicon-silicon bond (silicon material).

Here, examples of the material containing a silicon-silicon bond may include polysilicon (polycrystalline silicon), amorphous silicon, single-crystalline silicon, and the like. These materials may be doped with impurities. At this time, the impurity may be either an n-type impurity or a p-type impurity, examples of the p-type impurity may include Group 13 elements such as boron (B), aluminum (Al), gallium (Ga), and indium (In), and examples of the n-type impurity may include Group 15 elements such as phosphorus (P), arsenic (As), bismuth (Bi), and antimony (Sb).

A material containing a silicon-silicon bond (silicon material) preferably contains at least one type of material selected from the group consisting of polysilicon, amorphous silicon, and single-crystalline silicon. The material containing a silicon-silicon bond (silicon material) is more preferably polysilicon, amorphous silicon or single-crystalline silicon, from the viewpoint that the effect(s) of the present invention can be more remarkably obtained. That is, the surface treatment composition according to an embodiment of the present invention is particularly preferably used for surface treatment of a substrate (polished object) having a surface made of polysilicon, amorphous silicon, or single-crystalline silicon. Further, the surface treatment composition according to an embodiment of the present invention is most preferably used for surface treatment of a substrate (polished object) having a surface made of polysilicon or amorphous silicon, from the viewpoint that etching is easily promoted and the effect of reducing the surface roughness is further improved.

[Surface Treatment Composition]

The surface treatment composition according to an embodiment of the present invention can be used for reducing residues on a surface of a polished object. In addition, the surface treatment composition according to the present invention is used for reducing the surface roughness of a polished object.

In the present description, the cyclic amine compound having a nitrogen-containing non-aromatic heterocyclic ring as the component (A) is simply referred to as "cyclic amine compound according to the present invention" or "cyclic amine compound". In addition, the nonionic polymer as the component (B) is simply referred to as "nonionic polymer according to the present invention" or "nonionic polymer". The buffer represented by a formula: $A\text{-}COO^{-}NH_4^{+}$ (in the formula, A is an alkyl group having from 1 to 10 carbon atoms, or a phenyl group), as the component (C), is simply referred to as "buffer according to the present invention" or "ammonium monocarboxylate according to the present invention" or "ammonium monocarboxylate".

<Component (A)>

The surface treatment composition according to an embodiment of the present invention contains, as the component (A), a cyclic amine compound having a nitrogen-containing non-aromatic heterocyclic ring.

In the present description, the term "nitrogen-containing non-aromatic heterocyclic ring" refers to a non-aromatic cyclic structure containing at least a nitrogen atom and a carbon atom as constituent elements of the ring. Here, the term "non-aromatic" means having neither "aromaticity" nor "anti-aromaticity". That is, the term "non-aromatic heterocyclic ring" means a non-aromatic heterocyclic ring having neither aromaticity nor anti-aromaticity. The term "anti-aromaticity" means that the compound has a planar cyclic structure, all of the atoms constituting the cyclic structure constitute a conjugated π electron system, and the conjugated π electron system has 4n π electrons (where n is an integer of 1 or more).

The nitrogen-containing non-aromatic heterocyclic ring contained in the cyclic amine compound is preferably a nitrogen-containing aliphatic heterocyclic ring, and more preferably a monocyclic nitrogen-containing aliphatic heterocyclic ring, from the viewpoint of more remarkably obtaining the effect(s) of the surface treatment composition according to an embodiment of the present invention.

The number of ring-forming atoms of the "nitrogen-containing non-aromatic heterocyclic ring" is not particularly limited, but is preferably 5 or more, and more preferably 6 or more. An upper limit of the number of ring-forming atoms is also not particularly limited, but is preferably 10 or less, and more preferably 8 or less. Here, the "number of ring-forming atoms" represents the number of atoms constituting the ring itself of a compound (heterocyclic compound) having a structure in which atoms are bonded in the cyclic form (for example, a monocyclic ring, a fused ring, and a group of rings). Atoms that do not constitute the ring (for example, a hydrogen atom that terminates the bond between atoms constituting the ring) and atoms contained in a substituent when the ring is substituted with the substituent are not included in the number of ring-forming atoms. For example, the piperazine ring has 6 ring-forming atoms.

The number of nitrogen atoms contained in the cyclic amine compound according to the present invention is not particularly limited, but is preferably 2 or more, and more preferably 3 or more. When the cyclic amine compound has a plurality of nitrogen atoms, the cyclic amine compound is easily adsorbed to a surface of a polished object, to promote uniform etching, and the effect of reducing residues and surface roughness is further improved. An upper limit of the number of nitrogen atoms is also not particularly limited, but is preferably 5 or less, and more preferably 4 or less. By setting such an upper limit, the component (A) itself can be easily removed in the post-cleaning treatment after using the surface treatment composition according to the present invention. In addition, the nucleophilic attack of the cyclic amine compound on a surface of a polished object is appropriately limited, and as a result, excessive etching is suppressed, and the surface roughness of the polished object can be further reduced.

Therefore, the number of nitrogen atoms contained in the cyclic amine compound having a nitrogen-containing non-aromatic heterocyclic ring is preferably 2 or more and 4 or less, and more preferably 3. The "nitrogen atom contained in the cyclic amine compound" includes nitrogen atoms contained in a substituent substituted on the nitrogen-containing non-aromatic heterocyclic ring, in addition to nitrogen atoms contained in the nitrogen-containing non-aromatic heterocyclic ring. Therefore, the total number of nitrogen atoms present in the nitrogen-containing non-aromatic heterocyclic ring and nitrogen atoms present in the substituent substituted on the ring structure is preferably within the above range.

The form of the nitrogen atom contained in the cyclic amine compound according to the present invention is not particularly limited, and may be any of a tertiary nitrogen atom, a secondary nitrogen atom, and a primary nitrogen atom, or need not be bonded to a carbon atom. That is, in the cyclic amine compound according to the present invention, the number of carbon atoms to which the nitrogen atom is bonded may be any of 0 to 3. In the present description, the term "tertiary nitrogen atom" means a nitrogen atom to which three carbon atoms are bonded. Similarly, the term "secondary nitrogen atom" means a nitrogen atom to which two carbon atoms are bonded, and the term "primary nitrogen atom" means a nitrogen atom to which one carbon atom is bonded.

In an embodiment, the total of the number of primary nitrogen atoms and the number of secondary nitrogen atoms contained in the cyclic amine compound according to the present invention is preferably 2 or more, from the viewpoint that the effect of reducing the surface roughness of the polished object and the effect of reducing residues on the surface can be improved in a well-balanced manner. That is, the cyclic amine compound according to the present invention is preferably any one of a form having two or more primary nitrogen atoms, a form having two or more secondary nitrogen atoms, and a form having one or more primary nitrogen atoms and one or more secondary nitrogen atoms, more preferably a form having two or more primary nitrogen atoms or a form having one or more primary nitrogen atoms and one or more secondary nitrogen atoms, and particularly preferably a form having one or more primary nitrogen atoms and one or more secondary nitrogen atoms. As described above, when the cyclic amine compound has a primary and/or secondary nitrogen atom, as described later, the effect of reducing residues is further improved particularly when a nonionic polymer having a hydroxy group (—OH) is used as the component (B). An upper limit of the total of the number of primary nitrogen atoms and the number of secondary nitrogen atoms is not particularly limited, but for example, the total number is preferably 5 or less, more preferably 4 or less, and particularly preferably 3 or less.

In another embodiment, the cyclic amine compound according to the present invention preferably has one or more primary nitrogen atoms, one or more secondary nitrogen atoms, and one or more tertiary nitrogen atoms. An upper limit of the number of nitrogen atoms is not particularly limited, but as an example, an upper limit of the number of primary nitrogen atoms, an upper limit of the number of secondary nitrogen atoms, and an upper limit of the number of tertiary nitrogen atoms are each preferably 3 or less. From the same viewpoint, the cyclic amine compound more preferably has one primary nitrogen atom, one secondary nitrogen atom, and one tertiary nitrogen atom. As described above, it is presumed that when the cyclic amine compound has a plurality of nitrogen atoms having different bonding forms, etching on a surface of a polished object is further promoted, and the effect of reducing residues is further improved.

In the cyclic amine compound, the number of nitrogen atoms present in the nitrogen-containing non-aromatic heterocyclic ring is preferably 1 or more, and more preferably 2 or more, from the viewpoint of promoting etching of a surface of a polished object and further reducing residues. On the other hand, an upper limit of the number of nitrogen atoms present in the nitrogen-containing non-aromatic heterocyclic ring is not particularly limited, but is preferably 3 or less from the viewpoint of the removability of the component (A) itself, as described above.

Therefore, in the component (A), the number of nitrogen atoms contained in the nitrogen-containing non-aromatic heterocyclic ring is preferably 1 or more and 3 or less, and more preferably 2.

Among such cyclic amine compounds, the cyclic amine compound as the component (A) preferably has at least one selected from the group consisting of a pyrrolidine skeleton, a piperidine skeleton, a piperazine skeleton, and a diazepam skeleton, and more preferably has a piperazine skeleton.

Examples of the cyclic amine compound having a piperazine skeleton may include piperazine anhydrous, piperazine hexahydrate, 1-methylpiperazine, 2-methylpiperazine, 1-ethylpiperazine, 2-ethylpiperazine, 1-(n-propyl)piperazine, 2-(n-propyl)piperazine, 1-isopropylpiperazine, 1-allylpiperazine, 1-(n-butyl)piperazine, 1-isobutylpiperazine, 1-hydroxyethoxyethylpiperazine, 1-phenylpiperazine, 1-aminopiperazine, 1-amino-4-methylpiperazine, 1-(2-hydroxyethyl)piperazine, ethyl-1-piperazinecarboxylate, 1-formylpiperazine, 1-acetylpiperazine, 1-cyclopentylpiperazine, 1-cyclohexylpiperazine, 1-(2-methoxyethyl)piperazine, 1-piperonylpiperazine, 1-(diphenylmethyl)piperazine, 2-piperazinone, 1-methyl-3-phenylpiperazine, 1,4-bis(3-aminopropyl)piperazine, 1-(2-dimethylaminoethyl)-4-methylpiperazine, 1-(2-aminoethyl)piperazine (aminoethylpiperazine: AEP), 1,4-bis(3-aminopropyl)piperazine, 1,4-dimethylpiperazine, 2,5-dimethylpiperazine, 2,6-dimethylpiperazine, 1,4-diethylpiperazine, 1,4-dimethylpiperazin-2-one, 1,4-diethylpiperazin-2-one, 1,4-diformylpiperazine, 1-(4-aminophenyl)-4-methylpiperazine, 1,4-diacetyl-2,5-piperazinedione, 1-methyl-4-(1,4'-bipiperazin-4-yl)piperazine, 1-(4-aminophenyl)-4-(4-methoxyphenyl)piperazine, 1,4-dimethylpiperazine-2,3-dione, 2-piperazine carboxylic acid, and the like. These piperazine compounds can be used singly or two or more types thereof can be used in combination. In an embodiment, the component (A) preferably contains at least one selected from the group consisting of piperazine anhydrous, 1-ethylpiperazine, 1-amino-4-methylpiperazine, 1,4-bis(3-aminopropyl)piperazine, 1-(2-dimethylaminoethyl)-4-methylpiperazine, and 1-(2-aminoethyl)piperazine (aminoethylpiperazine).

Further, from the viewpoint that the effect of reducing the surface roughness of a polished object and the effect of reducing residues on the surface can be improved in a well-balanced manner, the cyclic amine compound having a nitrogen-containing non-aromatic heterocyclic ring according to the present invention is preferably a piperazine-based compound represented by Formula (a):

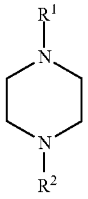

(a)

In the Formula (a), $R^1$ and $R^2$ are each independently a hydrogen atom; a primary amino group (—$NH_2$); or an alkyl group having from 1 to 10 carbon atoms and optionally substituted with any of primary, secondary and tertiary amino groups.

In Formula (a), $R^1$ and $R^2$ may be the same as or different from each other. The alkyl group having from 1 to 10 carbon atoms as $R^1$ and $R^2$ may be linear, branched, or cyclic.

Specific examples of a linear alkyl group may include a methyl group, an ethyl group, an n-propyl group, an n-butyl group, an n-pentyl group, an n-hexyl group, an n-heptyl group, an n-octyl group, an n-nonyl group, and an n-decyl group.

Specific examples of a branched alkyl group may include an isopropyl group, an isobutyl group, a sec-butyl group, a tert-butyl group, an isopentyl group, a tert-pentyl group, a neopentyl group, a 1,2-dimethylpropyl group, an isohexyl group, a 1,3-dimethylbutyl group, a 1-isopropylpropyl group, a 1,2-dimethylbutyl group, a 1,4-dimethylpentyl group, a 3-ethylpentyl group, a 2-methyl-1-isopropylpropyl group, a 1-ethyl-3-methylbutyl group, a 2-ethylhexyl group, a 3-methyl-1-isopropylbutyl group, a 2-methyl-1-isopropyl group, a 1-tert-butyl-2-methylpropyl group, an isodecyl group, and the like.

Specific examples of a cyclic(alicyclic)alkyl group may include cycloalkyl groups having from 3 to 10 carbon atoms, such as a cyclopropyl group, a cyclobutyl group, a cyclopentyl group, and a cyclohexyl group.

Among them, the alkyl groups as $R^1$ and $R^2$ are each preferably linear or branched, and more preferably linear.

An upper limit of the number of carbon atoms in the alkyl group is preferably 8 or less, more preferably 6 or less, still more preferably 5 or less, and particularly preferably 3 or less from the viewpoint of reducing organic residues. On the other hand, a lower limit of the number of carbon atoms in the alkyl group is preferably 2 or more. Therefore, as an example, the number of carbon atoms of the alkyl group as $R^1$ and $R^2$ is preferably 1 or more and 8 or less, more preferably 1 or more and 6 or less, still more preferably 1 or more and 5 or less, particularly preferably 1 or more and 3 or less, and most preferably 2.

The alkyl group may be substituted with any of primary, secondary and tertiary amino groups or unsubstituted. In the present description, the term "primary amino group" means —$NH_2$. Similarly, the term "secondary amino group" means a functional group (—$NHR^A$; wherein $R^A$ represents an organic group) having a structure in which one hydrogen atom and one organic group are each present on a nitrogen atom, and the bond between one of the carbon atoms constituting the organic group and the nitrogen atom is a single bond. Similarly, the term "tertiary amino group" means a functional group (—$N(R^B)(R^C)$; wherein $R^B$ and $R^C$ each independently represent an organic group) having a structure in which two identical or different organic groups are present on a nitrogen atom, and each bond between one of the carbon atoms constituting each organic group and the nitrogen atom is a single bond. The organic group as $R^A$ constituting the secondary amino group (—$NHR^A$) and the organic groups as $R^B$ and $R^C$ constituting the tertiary amino group (—$N(R^B)(R^C)$) mean a group containing a carbon atom.

$R^A$, $R^B$ and $R^C$ are each independently preferably a hydrocarbon group, more preferably an alkyl group or an aryl group, and more preferably an alkyl group.

The number of carbon atoms of the alkyl group as $R^A$, $R^B$, and $R^C$ is not particularly limited, but is preferably 1 or more and 10 or less from the viewpoint of excellent removability of the component (A) itself. Here, the alkyl group having from 1 to 10 carbon atoms may be linear, branched, or cyclic, and specific examples of such an alkyl group include those similar to the specific examples described for the alkyl group as $R^1$ and $R^2$.

Examples of the secondary amino group having the alkyl group include alkylamino groups having from 1 to 10 carbon atoms, such as a methylamino group, an ethylamino group, an n-propylamino group, an n-butylamino group, an isobutylamino group, an n-hexylamino group, an n-heptylamino group, an n-octylamino group, an n-nonylamino group, and an n-decylamino group. Examples of the tertiary amino group having the alkyl group include dialkylamino groups having from 2 to 20 carbon atoms, such as a dimethylamino group, a diethylamino group, a di-n-propylamino group, a di-n-butylamino group, and a methylethylamino group.

In Formula (a), when the alkyl group as $R^1$ and $R^2$ is substituted with any of primary, secondary and tertiary amino groups, the alkyl group is preferably substituted with a primary amino group or a tertiary amino group, and more preferably substituted with a primary amino group.

Among them, in Formula (a), $R^1$ and $R^2$ are preferably each independently a hydrogen atom; a primary amino group (—$NH_2$); or an alkyl group having from 1 to 5 carbon atoms and optionally substituted with a primary amino group or a tertiary amino group. $R^1$ and $R^2$ are more preferably each independently a hydrogen atom; a primary amino group (—$NH_2$); or an alkyl group having from 1 to 5 carbon atoms and optionally substituted with a primary amino group (—$NH_2$) or a dialkylamino group. Further, $R^1$ and $R^2$ are still more preferably each independently a hydrogen atom; a primary amino group (—$NH_2$); or an alkyl group having from 1 to 5 carbon atoms and optionally substituted with a primary amino group. Further, $R^1$ and $R^2$ are still even more preferably each independently a hydrogen atom; a primary amino group (—$NH_2$); or an alkyl group having from 1 to 3 carbon atoms and optionally substituted with a primary amino group. Further, $R^1$ and $R^2$ are particularly preferably each independently a hydrogen atom; or an alkyl group having from 1 to 3 carbon atoms and optionally substituted with a primary amino group. Further, $R^1$ and $R^2$ are most preferably each independently a hydrogen atom; or an alkyl group having from 1 to 3 carbon atoms and substituted with a primary amino group.

A molecular weight of the cyclic amine compound according to the present invention is not particularly limited, but is preferably less than 1,000, more preferably 500 or less, still more preferably 300 or less, still even more preferably 230 or less, particularly preferably 180 or less, and most preferably 150 or less. Meanwhile, a lower limit of the molecular weight is not particularly limited, but is preferably 50 or more, more preferably 60 or more, particularly preferably 80 or more, and most preferably 100 or more. As an example, the molecular weight of the cyclic amine compound is preferably 50 or more and less than 1,000, more preferably 60 or more and 500 or less, still more preferably 80 or more and 300 or less, still even more preferably 80 or more and 230 or less, particularly preferably 100 or more and 180 or less, and most preferably 100 or more and 150 or less.

The molecular weight of the cyclic amine compound (low molecular weight compound) can be measured by a known method such as gas chromatography-mass spectrometry (GC-MS). In addition, the molecular weight can be determined by specifying the structure of the compound by a method such as NMR and performing calculation based on the structure.

The cyclic amine compound that can be used as the component (A) may be produced by synthesis or may be a commercially available product. The cyclic amine compound as the component (A) can be used singly or two or more types thereof can be used in combination.

A content of the component (A) in the surface treatment composition is appropriately set according to the type of the component (A) to be used and the desired effect(s). A content of the component (A) is preferably 0.001 mass % or more, more preferably 0.005 mass % or more, and particularly preferably 0.01 mass % or more, with respect to 100 mass % of the total mass of the surface treatment composition (with respect to the surface treatment composition). An upper limit of the content of the component (A) in the surface treatment composition is preferably 0.5 mass % or less, more preferably 0.3 mass % or less, and particularly preferably 0.1 mass % or less, with respect to 100 mass % of the total mass of the surface treatment composition (with respect to the surface treatment composition). By setting the upper limit as described above, the component (A) itself is prevented from becoming a residue, and the residues can be efficiently removed. In an embodiment of the present invention, the content of the component (A) is 0.001 mass % or more and 0.5 mass % or less with respect to 100 mass % of the total mass of the surface treatment composition (with respect to the surface treatment composition). In an embodiment of the present invention, the content of the component (A) is 0.005 mass % or more and 0.3 mass % or less with respect to 100 mass % of the total mass of the surface treatment composition (with respect to the surface treatment composition). In an embodiment of the present invention, the content of the component (A) is 0.01 mass % or more and 0.1 mass % or less with respect to 100 mass % of the total mass of the surface treatment composition (with respect to the surface treatment composition). When the surface treatment composition contains two or more components (A), the content of the component (A) is intended to be the total amount thereof.

<Component (B)>

The surface treatment composition according to the present invention contains a nonionic polymer as the component (B). The term "nonionic polymer" as used herein refers to a polymer having no anionic group such as a carboxylic acid group, a sulfonic acid group or a phosphoric acid group, or cationic group such as an amino group or a quaternary ammonium group in the molecule.

When the surface treatment composition contains an anionic polymer in place of the component (B), the component (A) and the anionic polymer are aggregated, resulting in difficulty in preparing a surface treatment composition in which respective components are uniformly dispersed. In addition, when the surface treatment composition contains a cationic polymer such as polyethyleneimine in place of the component (B), a surface of a polished object which has been negatively charged under alkaline condition (that is, under the condition where the pH exceeds 7.0) is ionically bonded to the cationic polymer to form a protective film. Thus, sufficient etching does not proceed, making it difficult to reduce residues and surface roughness.

In contrast to these polymers, a nonionic polymer improves a wettability of a surface of a polished object without inhibiting a control of a zeta potential (positively charging) of a polished object, abrasive grain residues, organic residues, and the like by the component (A), thereby promoting removal of residues on a surface of a polished object (suppressing adhesion and re-adhesion of organic residues and the like).

The nonionic polymer is a polymer having identical (homopolymer) or different (copolymer) repeating constituent units, and can be typically a compound having a weight average molecular weight (Mw) of 1,000 or more. When a nonionic polymer is a copolymer, the form of the copolymer may be any of a block copolymer, a random copolymer, a graft copolymer, and an alternating copolymer.

Examples of the nonionic polymer may include polyvinyl alcohol, polyvinylpyrrolidone, polyacrylamide, poly(N-vinylacetamide), polyamines, polyvinyl ethers (polyvinyl methyl ether, polyvinyl ethyl ether, polyvinyl isobutyl ether, and the like), polyglycerin, polyethylene glycol, polypropylene glycol, water-soluble polysaccharides such as hydroxyethyl cellulose, alginic acid polyhydric alcohol esters, water-soluble urea resins, dextrin derivatives, casein, and the like. In addition, not only polymers having such a main chain structure but also graft copolymers having a nonionic polymer structure in a side chain thereof can be suitably used. Further, copolymers such as an ethylene-vinyl alcohol copolymer and a butenediol-vinyl alcohol copolymer can also be used. These nonionic polymers can be used singly or two or more types thereof can be used in combination.

Among them, the nonionic polymer preferably contains (1) a nonionic polymer containing a nitrogen atom and/or (2) a nonionic polymer containing a hydroxy group, from the viewpoint of further improving the effect of removing residues.

Preferred examples of the nonionic polymers of the above (1) and (2) include the following: polyvinyl alcohol, polyvinylpyrrolidone, polyacrylamide, poly(N-vinylacetamide), polyethylene glycol, hydroxyethyl cellulose, a butenediol-vinyl alcohol copolymer, and the like. Therefore, in an embodiment, the nonionic polymer as the component (B) preferably contains at least one selected from the group consisting of polyvinyl alcohol, polyvinylpyrrolidone, polyacrylamide, poly(N-vinylacetamide), polyethylene glycol, hydroxyethyl cellulose, and a butenediol-vinyl alcohol copolymer. In still another embodiment, the nonionic polymer preferably contains at least one selected from the group consisting of polyvinyl alcohol, polyvinylpyrrolidone, and poly(N-vinylacetamide). In still another embodiment, the nonionic polymer preferably contains polyvinyl alcohol or polyvinylpyrrolidone. In still another embodiment, the nonionic polymer preferably contains polyvinylpyrrolidone. Since these nonionic polymers are easily adsorbed to a surface of a polished object (particularly, a polished object containing a silicon-silicon bond), a water molecule film is easily formed. As a result, in particular, adhesion and re-adhesion of organic residues are effectively suppressed, and the effect of removing residues is further improved.

The reason why the nonionic polymers of the above (1) and (2) are preferable as the nonionic polymer is considered as follows.

In the case of using a nonionic polymer containing a nitrogen atom as in the above (1), a nitrogen atom contained in the nonionic polymer and the hydroxy group (—OH) present on the surface of the substrate (polished object) having a surface made of a silicon material are likely to be polarized positive (δ+) and negative (δ−), respectively. Thus, the nonionic polymer is easily adsorbed to a surface of a substrate (polished object) having a surface made of a silicon material. Therefore, it is considered that as a result of facilitating the formation of the water molecule film as described above, adhesion and re-adhesion of organic residues can be effectively suppressed. Accordingly, in an embodiment of the present invention, the nonionic polymer preferably contains a nitrogen atom. In an embodiment of the present invention, more preferably, the nonionic polymer contains at least one selected from the group consisting of polyvinylpyrrolidone, polyacrylamide, and poly(N-vinylacetamide), and the cyclic amine compound having a nitrogen-containing non-aromatic heterocyclic ring (component (A)) is a piperazine-based compound represented by the Formula (a). Further, in an embodiment of the present invention, more preferably, the nonionic polymer contains polyvinylpyrrolidone and/or poly(N-vinylacetamide), and the cyclic amine compound having a nitrogen-containing non-aromatic heterocyclic ring (component (A)) is a piperazine-based compound represented by the Formula (a). Further, in an embodiment of the present invention, more preferably, the nonionic polymer contains polyvinylpyrrolidone, and the cyclic amine compound having a nitrogen-containing non-aromatic heterocyclic ring (component (A)) is a piperazine-based compound represented by the Formula (a). Further, in each of the above embodiments, the preferred form of the piperazine-based compound represented by the Formula (a) is the form described in the section of <Component (A)>.

Also in the case of using a nonionic polymer containing a hydroxy group (—OH) as in the above (2), it is considered that the nonionic polymer is relatively easily adsorbed to a surface of a substrate (polished object) having a surface made of a silicon material, thus facilitating the formation of the water molecule film as described above, and as a result, adhesion and re-adhesion of organic residues can be effectively suppressed. Here, the present inventors have found that the effect of reducing residues is particularly improved when a specific component (A) is used in the form of the above (2). Specifically, the present inventors have found that when a nonionic polymer containing a hydroxy group (—OH) is used, an excellent effect of reducing residues can be obtained by using, as the component (A), a cyclic amine compound in which the total of the number of primary nitrogen atoms and the number of secondary nitrogen atoms is 2 or more.

The reason why in the form of the above (2), the component (A) is preferably a cyclic amine compound having the above structure is considered as follows.

When the component (A) contains a primary nitrogen atom and/or a secondary nitrogen atom, these nitrogen atoms are likely to be polarized negative (δ−), and the hydrogen atom bonded to the nitrogen atom is likely to be polarized positive (δ+). It is considered that such polarization is larger in a primary nitrogen atom and a secondary nitrogen atom than in a tertiary nitrogen atom.

On the other hand, in the hydroxy group (—OH) contained in the component (B), it is considered that an oxygen atom is polarized negative (δ−), and a hydrogen atom is polarized positive (δ+). Then, the hydroxy group (particularly, the hydrogen atom) of the component (B) is easily adsorbed to the primary nitrogen atom and/or the secondary nitrogen atom contained in the component (A), and as a result, the component (B) is also easily adsorbed on a polished object by the component (A) adsorbed on a polished object. That is, by the component (A) having two or more primary nitrogen atoms and/or secondary nitrogen atoms in total, the component (B) easily forms a water molecule film (protective film) on a surface of a polished object. It is therefore considered that the wettability of a surface of a polished object is further improved, and adhesion and re-adhesion of organic residues can be effectively suppressed. Note that the above mechanism is based on speculation, and the present invention should not be limited to the above mechanism at all.

Accordingly, in an embodiment of the present invention, preferably, the nonionic polymer contains a hydroxy group, and in the cyclic amine compound having a nitrogen-containing non-aromatic heterocyclic ring (component (A)), the total of the number of primary nitrogen atoms and the number of secondary nitrogen atoms is 2 or more. Here, in the embodiment, the preferred form of the cyclic amine compound is the form described in the section of <Component (A)>. As an example, the nonionic polymer contains a hydroxy group, and the cyclic amine compound having a nitrogen-containing non-aromatic heterocyclic ring (component (A)) is preferably in a form having two or more primary nitrogen atoms or in a form having one or more primary nitrogen atoms and one or more secondary nitrogen atoms, and more preferably in a form having one or more primary nitrogen atoms and one or more secondary nitrogen atoms. Further, in each of the above embodiments, the nonionic polymer preferably contains at least one selected from the group consisting of polyvinyl alcohol, polyethylene glycol, hydroxyethyl cellulose, and a butenediol-vinyl alcohol copolymer.

Further, according to an embodiment of the present invention, preferably, the nonionic polymer contains at least one selected from the group consisting of polyvinyl alcohol, polyethylene glycol, hydroxyethyl cellulose, and a butenediol-vinyl alcohol copolymer, and the cyclic amine compound having a nitrogen-containing non-aromatic heterocyclic ring is a piperazine-based compound represented by the Formula (a), wherein $R^1$ and $R^2$ are each independently a hydrogen atom; or an alkyl group having from 1 to 3 carbon atoms and substituted with a primary amino group. Further, in an embodiment of the present invention, preferably, the nonionic polymer contains polyvinyl alcohol and/or polyethylene glycol, and the cyclic amine compound having a nitrogen-containing non-aromatic heterocyclic ring is a piperazine-based compound represented by the Formula (a), wherein $R^1$ and $R^2$ are each independently a hydrogen atom; or an alkyl group having from 1 to 3 carbon atoms and substituted with a primary amino group. Further, according to an embodiment of the present invention, preferably, the nonionic polymer contains polyvinyl alcohol, and the cyclic amine compound having a nitrogen-containing non-aromatic heterocyclic ring is a piperazine-based compound represented by the Formula (a), wherein $R^1$ and $R^2$ each independently represent a hydrogen atom; or an alkyl group having from 1 to 3 carbon atoms and substituted with a primary amino group.

A lower limit of a weight average molecular weight (Mw) of the nonionic polymer is preferably 1,000 or more, more preferably 3,000 or more, still more preferably more than 5,000, particularly preferably 8,000 or more, and most preferably more than 10,000. An upper limit of a weight average molecular weight (Mw) of the nonionic polymer is preferably 1,000,000 or less, more preferably 100,000 or less, still more preferably 80,000 or less, particularly preferably 50,000 or less, and most preferably less than 50,000. As an example, the weight average molecular weight (Mw) of the nonionic polymer is preferably 1,000 or more and 1,000,000 or less, more preferably 3,000 or more and 100,000 or less, still more preferably more than 5,000 and 80,000 or less, particularly preferably 8,000 or more and 50,000 or less, and most preferably more than 10,000 and less than 50,000.

The weight average molecular weight (Mw) of the nonionic polymer can be measured as a value in terms of polyethylene glycol using gel permeation chromatography (GPC), and the details of the measurement method will be described in Examples described later.

The nonionic polymer that can be used as the component (B) may be produced by synthesis or may be a commercially available product. Examples of the commercially available product may include JMR (registered trademark)-10HH and JMR (registered trademark)-3HH (both manufactured by JAPAN VAM & POVAL Co., Ltd.), PITZCOL (registered trademark) K30A and K30L (both manufactured by DKS Co. Ltd.), CMC Daicel (registered trademark) 1150 and 1170 (both manufactured by Daicel Miraizu Ltd.), GE191-104 and 107 (both manufactured by Showa Denko K.K), and the like.

The nonionic polymer as the component (B) can be used singly or two or more types thereof can be used in combination.

A content of the component (B) in the surface treatment composition is appropriately set according to the type of the component (B) to be used and the desired effect(s). The content of the component (B) is preferably 0.0001 mass % or more, more preferably 0.001 mass % or more, still more preferably 0.01 mass % or more, and particularly preferably 0.03 mass % or more, with respect to 100 mass % of the total mass of the surface treatment composition (with respect to the surface treatment composition). An upper limit of the content of the component (B) in the surface treatment composition is preferably 1.5 mass % or less, more preferably 1.0 mass % or less, still more preferably 0.5 mass % or less, and particularly preferably 0.3 mass % or less, with respect to 100 mass % of the total mass of the surface treatment composition (with respect to the surface treatment composition). In an embodiment of the present invention, the content of the component (B) is 0.0001 mass % or more and 1.5 mass % or less with respect to 100 mass % of the total mass of the surface treatment composition (with respect to the surface treatment composition). In an embodiment of the present invention, the content of the component (B) is 0.001 mass % or more and 1.0 mass % or less with respect to 100 mass % of the total mass of the surface treatment composition (with respect to the surface treatment composition). In an embodiment of the present invention, the content of the component (B) is 0.01 mass % or more and 0.5 mass % or less with respect to 100 mass % of the total mass of the surface treatment composition (with respect to the surface treatment composition). In an embodiment of the present invention, the content of the component (B) is 0.03 mass % or more and 0.3 mass % or less with respect to 100 mass % of the total mass of the surface treatment composition (with respect to the surface treatment composition). When the surface treatment composition contains two or more components (B), the content of the component (B) intended to be the total amount thereof.

In place of or in addition to the above, a mixing ratio between the component (A) and the component (B) in the surface treatment composition is appropriately set according to the type of the component (A) and the component (B) to be used and the desired effect(s). The mixing ratio of the component (A) to the component (B) (content ratio of component (A)/component (B)) (mass ratio) is preferably 0.01 or more, more preferably 0.05 or more, still more preferably 0.1 or more, and particularly preferably more than 0.1. The mixing ratio of the component (A) to the component (B) (content ratio of component (A)/component (B)) (mass ratio) is preferably 10 or less, more preferably 5 or less, still more preferably 3 or less, and particularly preferably less than 3. In an embodiment of the present invention, the mixing ratio of the component (A) to the component (B) (content ratio of component (A)/component (B)) (mass ratio) is 0.01 or more and 10 or less. In an embodiment of the present invention, the mixing ratio of the component (A) to the component (B) (content ratio of component (A)/component (B)) (mass ratio) is 0.05 or more and 5 or less. In an embodiment of the present invention, the mixing ratio of the component (A) to the component (B) (content ratio of component (A)/component (B)) (mass ratio) is 0.1 or more and 3 or less. In an embodiment of the present invention, the mixing ratio of the component (A) to the component (B) (content ratio of component (A)/component (B)) (mass ratio) is more than 0.1 and less than 3.

<Component (C)>

The surface treatment composition according to the present invention contains the component (C) in addition to the components (A) and (B). The component (C) contains a buffer (ammonium monocarboxylate) represented by a formula: $A\text{-}COO^-NH_4^+$. As used herein, the term "buffer" is referred to as a substance that imparts a buffering action to the surface treatment composition (solution) in order to keep the pH constant.

The component (C) may contain a component (for example, a known buffer) other than the buffer represented by the formula: $A\text{-}COO^-NH_4^+$. From the viewpoint of further improving the effect(s) by the present invention, and the like, the component (C) is preferably composed of a buffer represented by the formula: $A\text{-}COO^-NH_4^+$ (the component (C) is a buffer represented by the formula: $A\text{-}COO^-NH_4^+$). Due to the presence of the component (C), residues remaining on a surface of a polished object can be efficiently removed. In addition, the surface roughness of a polished object can be suppressed low. That is, in a preferred embodiment of the present invention, the component (C) is composed of a buffer represented by the formula: $A\text{-}COO^-NH_4^+$ (the component (C) is a buffer represented by the formula: $A\text{-}COO^-NH_4^+$).

In the formula: $A\text{-}COO^-NH_4^+$, A is an alkyl group having from 1 to 10 carbon atoms, or a phenyl group. Here, examples of the alkyl group may include alkyl groups similar to those given as specific examples for the alkyl group as $R^1$ and $R^2$ in Formula (a). Among them, A is preferably a linear or branched alkyl group having from 1 to 8 carbon atoms, more preferably a linear or branched alkyl group having from 1 to 3 carbon atoms, still more preferably a methyl group (ammonium acetate) or an ethyl group (ammonium propionate), and particularly preferably a methyl group (ammonium acetate), from the viewpoint of further improving the effect(s) by the present invention, and the like. That is, in a preferred embodiment of the present invention, the buffer is represented by the formula: $A\text{-}COO^-NH_4^+$, wherein A is a linear or branched alkyl group having from 1 to 8 carbon atoms. In a more preferred embodiment of the present invention, the buffer is represented by the formula: $A\text{-}COO^-NH_4^+$, wherein A is a linear or branched alkyl group having from 1 to 3 carbon atoms. In a further preferred embodiment of the present invention, the buffer is represented by the formula: A-$COO^-NH_4^+$, wherein A is a methyl group or an ethyl group (the buffer is ammonium acetate or ammonium propionate). In a particularly preferred embodiment of the present invention, the buffer is ammonium acetate.

A content of the component (C) in the surface treatment composition is appropriately set according to the type of the component (C) to be used and the desired effect(s). The content of the component (C) is preferably 0.001 mass % or more, more preferably 0.005 mass % or more, and particularly preferably 0.01 mass % or more, with respect to 100 mass % of the total mass of the surface treatment composition (with respect to the surface treatment composition). An upper limit of the content of the component (C) in the surface treatment composition is preferably 0.5 mass % or less, more preferably 0.3 mass % or less, and particularly preferably 0.1 mass % or less, with respect to 100 mass % of the total mass of the surface treatment composition (with respect to the surface treatment composition). In an embodiment of the present invention, the content of the component (C) is 0.001 mass % or more and 0.5 mass % or less with respect to 100 mass % of the total mass of the surface treatment composition (with respect to the surface treatment composition). In an embodiment of the present invention, the content of the component (C) is 0.005 mass % or more and 0.3 mass % or less with respect to 100 mass % of the total mass of the surface treatment composition (with respect to the surface treatment composition). In an embodiment of the present invention, the content of the component (C) is 0.01 mass % or more and 0.1 mass % or less with respect to 100 mass % of the total mass of the surface treatment composition (with respect to the surface treatment composition). When the surface treatment composition contains two or more types of the components (C), the content of the component (C) is intended to be the total amount thereof.

In place of or in addition to the above, a mixing ratio between the component (A) and the component (C) in the surface treatment composition is appropriately set according to the type of the component (A) and the component (C) to be used and the desired effect(s). The mixing ratio of the component (A) to the component (C) (content ratio of component (A)/component (C)) (mass ratio) is preferably 0.01 or more, more preferably 0.1 or more, still more preferably 0.5 or more, and particularly preferably more than 0.5. The mixing ratio of the component (A) to the component (C) (content ratio of component (A)/component (C)) (mass ratio) is preferably 10 or less, more preferably 5 or less, still more preferably 3 or less, and particularly preferably less than 3.

In an embodiment of the present invention, the mixing ratio of the component (A) to the component (C) (content ratio of component (A)/component (C)) (mass ratio) is 0.01 or more and 10 or less. In an embodiment of the present invention, the mixing ratio of the component (A) to the component (C) (content ratio of component (A)/component (C)) (mass ratio) is 0.1 or more and 5 or less. In an embodiment of the present invention, the mixing ratio of the component (A) to the component (C) (content ratio of component (A)/component (C)) (mass ratio) is 0.5 or more and 3 or less. In an embodiment of the present invention, the mixing ratio of the component (A) to the component (C) (content ratio of component (A)/component (C)) (mass ratio) is more than 0.5 and less than 3.

<pH Adjusting Agent (Component (D))>

The surface treatment composition according to the present invention essentially contains the components (A) to (C), and preferably further contains a pH adjusting agent in addition to these components. That is, in a preferred embodiment of the present invention, the surface treatment composition further contains a component (D):

the component (D): a pH adjusting agent.

The pH adjusting agent is not particularly limited, and a known pH adjusting agent used in the field of the surface treatment composition can be used, and a known acid, base, a salt thereof, or the like can be used. Examples of the pH adjusting agent may include organic acids such as carboxylic acids including formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acid, and anthranilic acid, sulfonic acid, and organic phosphonic acid; inorganic acids such as nitric acid, carbonic acid, hydrochloric acid, phosphoric acid, hypophosphorous acid, phosphorous acid, phosphonic acid, boric acid, hydrofluoric acid, orthophosphoric acid, pyrophosphoric acid, polyphosphoric acid, metaphosphoric acid, and hexametaphosphoric acid; hydroxides of alkali metals, such as potassium hydroxide (KOH) and sodium hydroxide (NaOH); carbonates of alkali metals, such as potassium carbonate ($K_2CO_3$) and sodium carbonate ($Na_2CO_3$); hydroxide of Group 2 elements; ammonia (ammonium hydroxide); organic bases such as quaternary ammonium hydroxide compounds; and the like. As the pH adjusting agent, synthesized products or commercially available products may be used. These pH adjusting agents can be used singly or two or more types thereof can be used in combination. Among them, potassium hydroxide, sodium hydroxide, sodium carbonate, and ammonia are preferable, potassium hydroxide, sodium hydroxide, and ammonia are more preferable, and ammonia is particularly preferable. That is, in a preferred embodiment of the present invention, the pH adjusting agent is at least one selected from the group consisting of potassium hydroxide, sodium hydroxide, sodium carbonate, and ammonia. In a more preferred embodiment of the present invention, the pH adjusting agent is at least one selected from the group consisting of potassium hydroxide, sodium hydroxide, and ammonia. In a particularly preferred embodiment of the present invention, the pH adjusting agent is ammonia.

A content of the pH adjusting agent in the surface treatment composition may be appropriately selected so as to attain a desired pH value of the surface treatment composition described in detail below.

<pH of Surface Treatment Composition>

A pH of the surface treatment composition according to the present invention is more than 7.0. When the pH of the surface treatment composition is 7.0 or less, residues remaining on a surface of a polished object cannot be sufficiently removed. The pH of the surface treatment composition is preferably 7.5 or more, more preferably more than 7.5, still more preferably more than 8.5, particularly preferably more than 9.0, and most preferably more than 10.0 from the viewpoint of further improving the effect(s) according to the present invention (particularly, the removal of residues), and the like. The pH of the surface treatment composition is preferably less than 12.5, more preferably less than 12.0, still more preferably less than 11.5, and particularly preferably less than 11.0. That is, in an embodiment of the present invention, the pH of the surface treatment composition is 7.5 or more and less than 12.5. In an embodiment of the present invention, the pH of the surface treatment composition is more than 7.5 and less than 12.0. In an embodiment of the present invention, the pH of the surface treatment composition is more than 8.5 and less than 11.5. In an embodiment of the present invention, the pH of the surface treatment composition is more than 9.0 and less than 11.0. In an embodiment of the present invention, the pH of the surface treatment composition is more than 10.0 and less than 11.0. As the pH of the surface treatment composition, a value measured by the method described in Examples is adopted.

<Solvent>

The surface treatment composition according to the present invention preferably contains a solvent. The solvent serves to disperse or dissolve each component. The solvent preferably contains water, and is more preferably only water. The solvent may also be a mixed solvent of water and an organic solvent for dispersing or dissolving each component. In this case, examples of the organic solvent to be used may include acetone, acetonitrile, ethanol, methanol, isopropanol, glycerin, ethylene glycol, propylene glycol, triethanolamine, and the like, which are an organic solvent miscible with water. Alternatively, respective components may be dispersed or dissolved by using an organic solvent without being mixed with water, and then mixed with water. These organic solvents can be used singly or two or more types thereof can be used in combination.

From the viewpoint of preventing contamination on a polished object and inhibition of action(s) of other component(s), water that does not contain residues as much as possible is preferred. For example, water, in which a total content of transition metal ions is 100 ppb or less, is preferable. Here, purity of water can be increased by, for example, operations such as removal of a residual ion(s) with an ion exchange resin, removal of foreign substance(s) with a filter, and distillation. Specifically, for example, use of deionized water (ion-exchanged water), pure water, ultrapure water, distilled water, and the like is preferable.

<Surfactant>

The surface treatment composition according to the present invention may or may not further contain a surfactant. The type of the surfactant is not particularly limited, and the surfactant may be any of nonionic, anionic, cationic, and amphoteric surfactants.

Examples of the nonionic surfactant may include compounds other than the component (B), and examples thereof may include alkyl ether type surfactants such as polyoxyethylene lauryl ether and polyoxyethylene oleyl ether; alkylphenyl ether type surfactants such as polyoxyethylene octylphenyl ether; alkyl ester type surfactants such as polyoxyethylene laurate; alkylamine type surfactants such as polyoxyethylene laurylamino ether; alkylamide type surfactants such as polyoxyethylene lauric acid amide; polypropylene glycol ether type surfactants such as polyoxyethylene polyoxypropylene ether; alkanolamide type surfactants such as oleic acid diethanolamide; allyl phenyl ether type surfactants such as polyoxyalkylene allyl phenyl ether; and the like. In addition, propylene glycol, diethylene glycol, monoethanolamine, alcohol ethoxylate, alkylphenol ethoxylate, tertiary acetylene glycol, alkanolamide, and the like can also be used as the nonionic surfactant. Since the component (B) can serve as a nonionic surfactant, a nonionic surfactant is not necessarily separately added beside the component (B).

Examples of the anionic surfactant may include carboxylic acid type surfactants such as sodium myristate, sodium palmitate, sodium stearate, sodium laurate, and potassium laurate; sulfuric acid ester type surfactants such as sodium octyl sulfate; phosphoric acid ester type surfactants such as lauryl phosphate and sodium lauryl phosphate; sulfonic acid type surfactants such as sodium dioctyl sulfosuccinate and sodium dodecylbenzenesulfonate; and the like.

Examples of the cationic surfactant may include amines such as laurylamine hydrochloride.

Examples of the amphoteric surfactant may include lecithin, alkylamine oxides, alkyl betaines such as N-alkyl-N, N-dimethylammonium betaine, sulfobetaine, and the like.

The surfactant can be used singly or two or more types thereof can be used in combination. As the surfactant, commercially available products or synthesized products may be used.

When the surface treatment composition contains a surfactant, a lower limit of a content of the surfactant is preferably 0.01 mass % or more, and more preferably 0.05 mass % or more, with respect to 100 mass % of the total mass of the surface treatment composition. An upper limit of a content of the surfactant in the surface treatment composition is preferably 5 mass % or less, and more preferably 1 mass % or less, with respect to 100 mass % of the total mass of the surface treatment composition. When the surface treatment composition contains two or more types of surfactants, the content of the surfactant is intended to be a total amount thereof <Chelating Agent>

The surface treatment composition according to the present invention may or may not further contain a chelating agent. Examples of the chelating agent may include aminocarboxylic acid-based chelating agents and organic phosphonic acid-based chelating agents. Examples of the aminocarboxylic acid-based chelating agent may include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetramine hexaacetic acid, and sodium triethylenetetramine hexaacetate. Examples of the organic phosphonic acid-based chelating agent may include 2-aminoethylphosphonic acid, 1-hydroxyethylidene-1,1-diphosphonic acid, aminotri(methylenephosphonic acid), ethylenediaminetetrakis(methylenephosphonic acid) (EDTPO), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxy phosphonic acid, 2-phosphonobutane-1,2-dicarboxylic acid, 1-phosphonobutane-2,3,4-tricarboxylic acid, and α-methylphosphonosuccinic acid. Among them, the organic phosphonic acid-based chelating agent is more preferable. Among them, ethylenediaminetetrakis(methylenephosphonic acid), diethylenetriaminepenta(methylenephosphonic acid), and diethylenetriaminepentaacetic acid are exemplified as a preferable chelating agent. As a particularly preferable cheating agent, ethylenediaminetetrakis(methylenephosphonic acid) and diethylenetriaminepenta(methylenephosphonic acid) are exemplified.

The chelating agent can be used singly or two or more types thereof can be used in combination. As the chelating agent, commercially available products or synthesized products may be used.

When the surface treatment composition contains a chelating agent, a lower limit of a content of the chelating agent is preferably 0.0001 mass % or more, more preferably 0.001 mass % or more, and still more preferably 0.002 mass % or more, with respect to 100 mass % of the total mass of the surface treatment composition. An upper limit of a content of the chelating agent is preferably 1 mass % or less, more preferably 0.5 mass % or less, still more preferably 0.3 mass % or less, and particularly preferably 0.15 mass % or less. When the surface treatment composition contains two or more types of chelating agents, the content of the chelating agent is intended to be a total amount thereof <Other Additives>

The surface treatment composition according to an embodiment of the present invention may contain other additive(s) at any proportion as necessary as long as the effect(s) by the present invention is not impaired. That is, the surface treatment composition according to the present invention may or may not further contain other additives. It is desirable that components other than the essential components of the surface treatment composition according to an embodiment of the present invention are not added (not contained) as much as possible because such components may cause foreign substances (residues). Therefore, an amount thereof is preferably as small as possible. Examples of the other additive may include antifungal agents (antiseptic agents), dissolved gases, reducing agents, oxidizing agents, and the like. The surface treatment composition according to the present invention contains a nonionic polymer and is alkaline. Therefore, among these additives, the surface treatment composition according to the present invention preferably contains an antifungal agent (antiseptic agent). When the surface treatment composition according to the present invention contains an antifungal agent (antiseptic agent), the antifungal agent (antiseptic agent) that can be used is not particularly limited, and can be appropriately selected according to the type of the nonionic polymer (component (B)). Specific examples of the antifungal agent (antiseptic agent) may include isothiazoline-based antifungal agents such as 2-methyl-4-isothiazolin-3-one, 5-chloro-2-methyl-4-isothiazolin-3-one, and 1,2-benzisothiazol-3 (2H)-one (BIT), phenoxyethanol, and the like.

Alternatively, the antifungal agent (antiseptic agent) may be a compound represented by the following Chemical Formula 1.

(Chemical Formula 1)

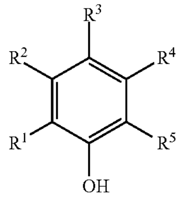

In Chemical Formula 1, $R^1$ to $R^5$ are each independently a hydrogen atom, or a substituent including at least two atoms selected from the group consisting of a carbon atom, a hydrogen atom, and an oxygen atom.

Examples of the substituent including at least two atoms selected from the group consisting of a carbon atom, a hydrogen atom, and an oxygen atom may include a hydroxy group, a carboxy group, an alkyl group having from 1 to 20 carbon atoms, a hydroxyalkyl group having from 1 to 20 carbon atoms, an alkoxy group having from 1 to 20 carbon atoms, a hydroxyalkoxy group having from 1 to 20 carbon atoms, an alkoxycarbonyl group having from 2 to 21 carbon atoms, an aryl group having from 6 to 30 carbon atoms, an aralkyl group (arylalkyl group) having from 7 to 31 carbon atoms, an aryloxy group having from 6 to 30 carbon atoms, an aryloxycarbonyl group having from 6 to 30 carbon atoms, an aralkyloxycarbonyl group having from 8 to 32 carbon atoms, an acyl group having from 2 to 20 carbon atoms, an acyloxy group having from 2 to 20 carbon atoms, and the like.

More specifically, examples of the alkyl group having from 1 to 20 carbon atoms may include linear alkyl groups such as a methyl group, an ethyl group, an n-propyl group, an n-butyl group, an n-pentyl group, an n-hexyl group, an n-heptyl group, an n-octyl group, an n-nonyl group, and an n-decyl group; branched alkyl groups such as an isopropyl group, an isobutyl group, an s-butyl group, a t-butyl group, a t-amyl group, a neopentyl group, a 3-methylpentyl group, a 1,1-diethylpropyl group, a 1,1-dimethylbutyl group, a 1-methyl-1-propylbutyl group, a 1,1-dipropylbutyl group, a 1,1-dimethyl-2-methylpropyl group, and a 1-methyl-1-isopropyl-2-methylpropyl group; cyclic alkyl groups such as a cyclobutyl group, a cyclopentyl group, a cyclohexyl group, a cycloheptyl group, a cyclooctyl group, and a norbornenyl group; and the like.

Examples of the hydroxyalkyl group having from 1 to 20 carbon atoms may include a hydroxymethyl group, a 2-hydroxyethyl group, a 2-hydroxy-n-propyl group, a 3-hydroxy-n-propyl group, a 2-hydroxy-n-butyl group, a 3-hydroxy-n-butyl group, a 4-hydroxy-n-butyl group, a 2-hydroxy-n-pentyl group, a 3-hydroxy-n-pentyl group, a 4-hydroxy-n-pentyl group, a 5-hydroxy-n-pentyl group, a 2-hydroxy-n-hexyl group, a 3-hydroxy-n-hexyl group, a 4-hydroxy-n-hexyl group, a 5-hydroxy-n-hexyl group, a 6-hydroxy-n-hexyl group, and the like.

Examples of the alkoxy group having from 1 to 20 carbon atoms may include linear alkoxy groups such as a methoxy group, an ethoxy group, an n-propyloxy group, an n-butyloxy group, an n-pentyloxy group, an n-hexyloxy group, an n-heptyloxy group, an n-octyloxy group, an n-nonyloxy group, and an n-decyloxy group; branched alkoxy groups such as an isopropyloxy group, an isobutyloxy group, an s-butyloxy group, a t-butyloxy group, a t-amyloxy group, a neopentyloxy group, a 3-methylpentyloxy group, a 1,1-diethylpropyloxy group, a 1,1-dimethylbutyloxy group, a 1-methyl-1-propylbutyloxy group, a 1,1 dipropylbutyloxy group, a 1,1-dimethyl-2-methylpropyloxy group, and a 1-methyl-1-isopropyl-2-methylpropyloxy group; cyclic alkoxy groups such as a cyclobutyloxy group, a cyclopentyloxy group, a cyclohexyloxy group, a cycloheptyloxy group, a cyclooctyloxy group, and a norbornenyloxy group; and the like.

Examples of the hydroxyalkoxy group having from 1 to 20 carbon atoms may include a hydroxymethoxy group, a 2-hydroxyethoxy group, a 2-hydroxy-n-propyloxy group, a 3-hydroxy-n-propyloxy group, a 2-hydroxy-n-butyloxy group, a 3-hydroxy-n-butyloxy group, a 4-hydroxy-n-butyloxy group, a 2-hydroxy-n-pentyloxy group, a 3-hydroxy-n-pentyloxy group, a 4-hydroxy-n-pentyloxy group, a 5-hydroxy-n-pentyloxy group, a 2-hydroxy-n-hexyloxy group, a 3-hydroxy-n-hexyloxy group, a 4-hydroxy-n-hexyloxy group, a 5-hydroxy-n-hexyloxy group, a 6-hydroxy-n-hexyloxy group, and the like.

Examples of the alkoxycarbonyl group having from 2 to 21 carbon atoms may include a methoxycarbonyl group, an ethoxycarbonyl group, a propoxycarbonyl group, a butoxycarbonyl group, a pentyloxycarbonyl group, a hexyloxycarbonyl group, an octyloxycarbonyl group, a decyloxycarbonyl group, and the like.

Examples of the aryl group having from 6 to 30 carbon atoms may include a phenyl group, a naphthyl group, an anthranil group, a pyrenyl group, and the like.

Examples of the aralkyl group (arylalkyl group) having from 7 to 31 carbon atoms may include a benzyl group, a phenethyl group (phenyl ethyl group), and the like. Examples of the aryloxy group having from 6 to 30 carbon atoms may include a phenyloxy group (phenoxy group), a naphthyloxy group, an anthraniloxy group, a pyrenyloxy group, and the like.

Examples of the aryloxycarbonyl group having from 7 to 31 carbon atoms may include a phenyloxycarbonyl group, a naphthyloxycarbonyl group, an anthranyloxycarbonyl group, a pyrenyloxycarbonyl group, and the like.

Examples of the aralkyloxycarbonyl group having from 8 to 32 carbon atoms may include a benzyloxycarbonyl group, a phenethyloxycarbonyl group, and the like.

Examples of the acyl group having from 1 to 20 carbon atoms may include a methanoyl group (formyl group), an ethanoyl group (acetyl group), a propanoyl group, a butanoyl group, a pentanoyl group, a hexanoyl group, an octanoyl group, a decanoyl group, a benzoyl group, and the like.

Examples of the acyloxy group having from 1 to 20 carbon atoms may include a formyloxy group, an acetyloxy group, a propanoyloxy group, a butanoyloxy group, a pentanoyloxy group, a hexanoyloxy group, an octanoyloxy group, a decanoyloxy group, a benzoyloxy group, and the like.

Further, the antifungal agent represented by the Chemical Formula 1 is preferably at least one selected from the group consisting of compounds represented by Chemical Formulae 1-a to 1-c.

(Chemical Formula 1-a)

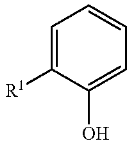

(Chemical Formula 1-b)

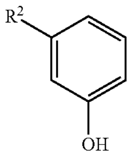

(Chemical Formula 1-c)

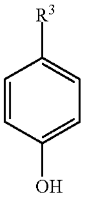

In Chemical Formulae 1-a to 1-c, $R^1$ to $R^3$ are each independently a substituent including at least two atoms selected from the group consisting of a carbon atom, a hydrogen atom, and an oxygen atom.

Examples of the substituent including at least two atoms selected from the group consisting of a carbon atom, a hydrogen atom, and an oxygen atom are the same as those described above, and thus the description thereof is omitted here.

More specific examples of the compound represented by the Chemical Formula 1 may include para-oxybenzoic acid esters (para-hydroxybenzoic acid esters) such as methyl para-oxybenzoate (methyl para-hydroxybenzoate), ethyl para-oxybenzoate (ethyl para-hydroxybenzoate), butyl para-oxybenzoate (butyl para-hydroxybenzoate), and benzyl para-oxybenzoate (benzyl para-hydroxybenzoate); salicylic acid, methyl salicylate, phenol, catechol, resorcinol, hydroquinone, isopropylphenol, cresol, thymol, phenoxyethanol, phenylphenols (2-phenylphenol, 3-phenylphenol, and 4-phenylphenol), 2-phenylethyl alcohol (phenethyl alcohol), and the like.

Among them, from the viewpoint of more effectively exhibiting expected effect(s) by the present invention, the compound represented by the Chemical Formula 1 is preferably at least one selected from the group consisting of ethyl para-oxybenzoate, butyl para-oxybenzoate, and phenylphenol, and more preferably butyl para-oxybenzoate.

Alternatively, the antifungal agent (antiseptic agent) can be an unsaturated fatty acid. Examples of the unsaturated fatty acid may include monounsaturated fatty acids such as crotonic acid, myristoleic acid, palmitoleic acid, oleic acid, and ricinoleic acid; diunsaturated fatty acids such as sorbic acid, linoleic acid, and eicosadienoic acid; triunsaturated fatty acids such as linolenic acid, pinolenic acid, and eleostearic acid; tetraunsaturated fatty acids such as stearidonic acid and arachidonic acid; pentaunsaturated fatty acids such as bosseopentaenoic acid and eicosapentaenoic acid; hexaunsaturated fatty acids such as docosahexaenoic acid and nisinic acid; and the like.

Among them, the unsaturated fatty acid is preferably sorbic acid, from the viewpoint of more effectively exhibiting expected effect(s) by the present invention.

In addition to the above, 1,2-alkanediols such as 1,2-pentanediol, 1,2-hexanediol, and 1,2-octanediol; alkyl glyceryl ethers such as 2-ethylhexyl glyceryl ether (ethylhexylglycerin); and compounds such as capric acid, dehydroacetic acid, and the like may be used as the antifungal agent (antiseptic agent).

The antifungal agent (antiseptic agent) may be used singly or two or more types thereof may be used in combination.

When the surface treatment composition contains an antifungal agent (antiseptic agent), a lower limit of a content (concentration) of the antifungal agent (antiseptic agent) is not particularly limited, but is preferably 0.0001 mass % or more, more preferably 0.001 mass % or more, still more preferably 0.005 mass % or more, and particularly preferably 0.01 mass % or more, with respect to 100 mass % of the total mass of the surface treatment composition (with respect to the surface treatment composition). An upper limit of a content (concentration) of the antifungal agent (antiseptic agent) is not particularly limited, but is preferably 5 mass % or less, more preferably 1 mass % or less, still more preferably 0.5 mass % or less, and particularly preferably 0.1 mass % or less, with respect to 100 mass % of the total mass of the surface treatment composition (with respect to the surface treatment composition). That is, the content (concentration) of the antifungal agent (antiseptic agent) in the surface treatment composition is preferably 0.0001 mass % or more and 5 mass % or less, more preferably 0.001 mass % or more and 1 mass % or less, still more preferably 0.005 mass % or more and 0.5 mass % or less, and particularly preferably 0.01 mass % or more and 0.1 mass % or less, with respect to 100 mass % of the total mass of the surface treatment composition (with respect to the surface treatment composition). Within such a range, an effect sufficient to inactivate or destroy a microorganism(s) can be obtained. When the surface treatment composition contains two or more types of antifungal agents (antiseptic agents), the above content is intended to be a total amount thereof.

In an embodiment of the present invention, the surface treatment composition is substantially composed of a cyclic amine compound having a nitrogen-containing non-aromatic heterocyclic ring (as the component (A)), a nonionic polymer (as the component (B)), a buffer (as the component (C)), a pH adjusting agent (as the component (D)) and water, and at least one selected from the group consisting of an antifungal agent, an organic solvent, a surfactant, and a chelating agent. In an embodiment of the present invention, the surface treatment composition is substantially composed of a cyclic amine compound having a nitrogen-containing non-aromatic heterocyclic ring (as the component (A)), a nonionic polymer (as the component (B)), a buffer (as the component (C)), a pH adjusting agent (as the component (D)) and water, and at least one of an antifungal agent or an organic solvent. In an embodiment of the present invention, the surface treatment composition is substantially composed of a cyclic amine compound having a nitrogen-containing non-aromatic heterocyclic ring (as the component (A)), a nonionic polymer (as the component (B)), a buffer (as the component (C)), a pH adjusting agent (as the component (D)), and water. In the embodiments, the phrase "the surface treatment composition is substantially composed of X" means that a total content of X exceeds 99 mass % (upper limit: 100 mass %) with respect to 100 mass % of the total mass of the surface treatment composition (with respect to the surface treatment composition). Preferably, the surface treatment composition is composed of X (the total content=100 mass %). For example, the phrase "the surface treatment composition is substantially composed of a cyclic amine compound having a nitrogen-containing non-aromatic heterocyclic ring (as the component (A)), a nonionic polymer (as the component (B)), a buffer (as the component (C)), a pH adjusting agent (as the component (D)) and water, and at least one of an antifungal agent or an organic solvent" means that the total content of the cyclic amine compound having a nitrogen-containing non-aromatic heterocyclic ring (as the component (A)), the nonionic polymer (as the component (B)), the buffer (as the component (C)), the pH adjusting agent (as the component (D)) and water, and the antifungal agent and the organic solvent exceeds 99 mass % (upper limit: 100 mass %) with respect to 100 mass % of the total mass of the surface treatment composition (with respect to the surface treatment composition). The surface treatment composition is preferably composed of the cyclic amine compound having a nitrogen-containing non-aromatic heterocyclic ring (as the component (A)), the nonionic polymer (as the component (B)), the buffer (as the component (C)), the pH adjusting agent (as the component (D)) and water, and at least one of the antifungal agent or the organic solvent (the total content=100 mass %).

For further improving the effect of removing residues (foreign substances), the surface treatment composition according to the present invention preferably does not substantially contain abrasive grains. As used herein, the phrase "does not substantially contain abrasive grains" means that a content of abrasive grains with respect to the surface treatment composition is less than 0.01 mass %. That is, in an embodiment of the present invention, a content of abrasive grains is less than 0.01 mass % (lower limit: 0 mass %) with respect to 100 mass % of the total mass of the surface treatment composition (with respect to the surface treatment composition).

<Method for Producing Surface Treatment Composition>

A method for producing a surface treatment composition according to the present invention is not particularly limited. For example, the surface treatment composition can be obtained by stirring and mixing the component (A) (cyclic amine compound having a nitrogen-containing non-aromatic heterocyclic ring), the component (B) (nonionic polymer), the component (C) (buffer), and as necessary, at least one selected from the group consisting of the component (D) (pH adjusting agent), a surfactant, a chelating agent, water, an organic solvent, an antifungal agent (antiseptic agent), and other additives. In an embodiment of the present invention, the surface treatment composition according to the present invention is produced by stirring and mixing the component (A) (cyclic amine compound having a nitrogen-containing non-aromatic heterocyclic ring), the component (B) (nonionic polymer), the component (C) (buffer), the component (D) (pH adjusting agent) and water, and at least one selected from the group consisting of an antifungal agent, an organic solvent, a surfactant, and a chelating agent. In an embodiment of the present invention, the surface treatment composition according to the present invention is produced by stirring and mixing the component (A) (cyclic amine compound having a nitrogen-containing non-aromatic heterocyclic ring), the component (B) (nonionic polymer), the component (C) (buffer), the component (D) (pH adjusting agent) and water, and at least one of an antifungal agent or an organic solvent. In an embodiment of the present invention, the surface treatment composition according to the present invention is produced by stirring and mixing the component (A) (cyclic amine compound having a nitrogen-containing non-aromatic heterocyclic ring), the component (B) (nonionic polymer), the component (C) (buffer), the component (D) (pH adjusting agent), and water. A temperature at which each component is mixed is not particularly limited, but is preferably 10° C. or higher and 40° C. or lower, and heating may be performed in order to increase a dissolution rate. A mixing time is also not particularly limited.

[Surface Treatment Method]

With the surface treatment composition according to the present invention, residues remaining on a surface of a polished object can be sufficiently removed. In addition, the surface roughness of a polished object (particularly, a polished substrate having a silicon-silicon bond) can be reduced. Therefore, the present invention is to provide a surface treatment method including subjecting a polished object to surface treatment using the surface treatment composition according to the present invention. Here, the polished object may contain a material containing a silicon-silicon bond (silicon material). That is, an embodiment of the present invention provides a surface treatment method including subjecting a polished object having a silicon-silicon bond to surface treatment using the surface treatment composition according to the present invention, to reduce a residue on a surface of the polished object while reducing a surface roughness of the polished object. As used herein, the term "surface treatment method" refers to a method of reducing residues on a surface of a polished object, and is a method of cleaning in a broad sense.

With the surface treatment method according to the present invention, residues remaining on a surface of a polished object can be sufficiently removed. That is, the present invention also is to provide a method for reducing residues on a surface of a polished object, the method including subjecting the polished object to surface treatment using the surface treatment composition according to the present invention. In addition, the present invention is to provide a method for reducing residues on a surface of a polished object, the method including subjecting the polished object containing a material containing a silicon-silicon bond (silicon material) to surface treatment using the surface treatment composition according to the present invention.

In addition, according to the surface treatment method according to the present invention, the surface roughness of a polished object can be reduced. That is, the present invention also is to provide a method for reducing a surface roughness of a polished object, the method including subjecting the polished object to surface treatment using the surface treatment composition according to the present invention. In addition, the present invention is to provide a method for reducing a surface roughness of a polished object, the method including subjecting the polished object containing a material containing a silicon-silicon bond (silicon material) to surface treatment using the surface treatment composition according to the present invention.

The surface treatment method according to the present invention is performed by directly contacting the polished object with the surface treatment composition according to the present invention.

Examples of the surface treatment method mainly include (I) a method of performing the surface treatment by rinse polishing treatment, and (II) a method of performing the surface treatment by cleaning treatment. That is, in an embodiment of the present invention, the surface treatment method is a rinse polishing treatment method or a cleaning treatment method (the surface treatment is carried out by a rinse polishing treatment or a cleaning treatment). The rinse polishing treatment and the cleaning treatment can be performed in order to remove foreign substances (abrasive grain (particle) residues, organic residues such as a polymer(s) and pad debris, metal contaminants, and the like) on a surface of a polished object and to obtain a clean surface. Hereinafter, the (I) and (II) methods will be described.

(I) Rinse Polishing Treatment

The surface treatment composition according to the present invention can be suitably used in rinse polishing treatment. That is, the surface treatment composition according to the present invention can be preferably used as a composition for rinse polishing. The rinse polishing treatment is performed on a polishing table (platen) to which a polishing pad is attached for the purpose of removing foreign substances on a surface of a polished object after final polishing (finish polishing) is performed on an object to be polished to obtain the polished object. The rinse polishing treatment may be performed by bringing the surface treatment composition according to the present invention into direct contact with the polished object. As a result, foreign substances on the surface of the polished object can be removed by frictional force (physical action) by the polishing pad and chemical action by the surface treatment composition. Among the foreign substances, particularly, abrasive grain (particle) residues and organic residues can be easily removed by the physical action. Therefore, in the rinse polishing treatment, abrasive grain (particle) residues and organic residues can be effectively removed by using friction with the polishing pad on the polishing table (platen). Here, in the surface treatment using the surface treatment composition according to the present invention, a surface of a polished object can be etched by frictional force (physical action) by the polishing pad and chemical action by the surface treatment composition. Then, abrasive grain residues and organic residues are removed by this etching, so that reduction efficiency of these residues is further improved. At this time, the surface of the polished object is uniformly etched, so that the surface roughness can also be reduced.

That is, in the present description, the rinse polishing treatment, the rinse polishing method, and the rinse polishing step respectively refer to a treatment, a method, and a step of reducing the surface roughness of an object to be subjected to surface treatment and residues on the surface of the object, using a polishing pad.

Specifically, the rinse polishing treatment can be performed by placing a polished object after the polishing step on a polishing table (platen) of a polishing apparatus, and relatively sliding the polished object and the polishing pad while the polishing pad and the polished semiconductor substrate are brought into contact with each other and the surface treatment composition is supplied to the contact portion.

As the polishing apparatus, a general polishing apparatus can be used that includes a holder for holding an object to be polished, a motor having a changeable rotation number or the like, and a polishing table to which a polishing pad (polishing cloth) can be attached.

The rinse polishing treatment can be performed using either a single-side polishing apparatus or a double-side polishing apparatus. In addition, the polishing apparatus preferably includes a nozzle for discharging the surface treatment composition in addition to a nozzle for discharging a polishing composition. Operating conditions of the polishing apparatus during the rinse polishing treatment are not particularly limited, and those skilled in the art can appropriately select the operating conditions.

As the polishing pad, a general non-woven fabric, polyurethane, a porous fluororesin, or the like can be used without any particular limitation. The polishing pad is preferably subjected to groove processing such that the surface treatment composition is accumulated in the grooves.

Rinse polishing conditions are also not particularly limited. For example, the rotation number of a polishing table and the rotation number of a head (carrier) are preferably 10 rpm (0.17 $s^{-1}$) or more and 100 rpm (1.67 $s^{-1}$) or less, and a pressure (polishing pressure) applied to a polished object is preferably 0.5 psi (3.4 kPa) or more and 10 psi (68.9 kPa) or less. A method for supplying the surface treatment composition to a polishing pad is not particularly limited. For example, a method in which the surface treatment composition is continuously supplied using a pump or the like can be employed (continuously pouring without recycle). A supply amount of the surface treatment composition is not limited, but preferably is such that a surface of a polishing pad is always covered with the surface treatment composition. A supply amount is preferably 10 mL/min or more and 5,000 mL/min or less. A rinse polishing time is also not particularly limited, but is preferably 5 seconds or more and 180 seconds or less.

After the rinse polishing treatment with the surface treatment composition according to the present invention, a polished object (object to be subjected to surface treatment) is preferably pulled up and taken out while the surface treatment composition according to the present invention is applied thereto.

(II) Cleaning Treatment

The surface treatment composition according to the present invention may be used in cleaning treatment. That is, the surface treatment composition according to the present invention can be preferably used as a composition for cleaning. The cleaning treatment is preferably performed for the purpose of removing foreign substances on a surface of a polished object (object to be cleaned) after an object to be polished is subjected to final polishing (finish polishing) and then to the rinse polishing treatment or to another rinse polishing treatment using a composition for rinse polishing other than the surface treatment composition according to the present invention to obtain the polished object (object to be cleaned). It should be understood that the cleaning treatment and the rinse polishing treatment are classified according to places where these treatments are performed, i.e., the cleaning treatment is performed at a place other than a polishing table (platen), and is preferably performed after a polished object is removed from a polishing table (platen). Also in the cleaning treatment, foreign substances on a surface of a polished object can be removed by bringing the surface treatment composition according to the present invention into direct contact with the polished object.

Examples of the method of performing cleaning treatment may include: (i) a method of bringing a cleaning brush into contact with one surface or both surfaces of a polished object while holding the polished object, and rubbing the surface of an object to be cleaned with the cleaning brush while supplying the surface treatment composition to the contact portion; (ii) a method of immersing a polished object in the surface treatment composition, and performing ultrasonic treatment or stirring (dip method); and the like. In such a method, foreign substances on the surface of the polished object can be removed by frictional force by the cleaning brush, mechanical force generated by the ultrasonic treatment or stirring, and chemical action by the surface treatment composition.

In the method (i), the method of bringing the surface treatment composition into contact with the polished object is not particularly limited. Examples thereof may include a spin method involving rotating a polished object at a high speed while pouring the surface treatment composition onto the polished object from a nozzle, a spray method involving spraying the surface treatment composition onto a polished object to perform cleaning, and the like.

From the viewpoint of more efficiently removing contamination in a short time, it is preferable to employ the spin method or the spray method for the cleaning treatment, and the spin method is more preferable.

Examples of an apparatus for performing such a cleaning treatment may include a batch-type cleaning apparatus for simultaneously subjecting a plurality of polished objects accommodated in a cassette to surface treatment, a single wafer cleaning apparatus for subjecting a single polished object to surface treatment with the single polished object attached to a holder, and the like. From the viewpoint of shortening a cleaning time and the like, a method using a single wafer cleaning apparatus is preferable.

Further, as an apparatus for performing cleaning treatment, a polishing apparatus including a cleaning equipment for rubbing, with a cleaning brush, a polished object that has been removed from a polishing table (platen) may be exemplified. By using such a polishing apparatus, the cleaning treatment of a polished object can be more efficiently performed.

As such a polishing apparatus, a general polishing apparatus including a holder for holding a polished object, a motor having a changeable rotation number, a cleaning brush, and the like can be used. As a polishing apparatus, either a single-side polishing apparatus or a double-side polishing apparatus may be used. When the rinse polishing step is performed after a CMP step, it is more efficient and preferable to perform the cleaning treatment using the same apparatus as the polishing apparatus used in the rinse polishing step.

The cleaning brush is not particularly limited, but is preferably a resin brush. A material of the resin brush is not particularly limited, but is preferably PVA (polyvinyl alcohol). The cleaning brush is more preferably a PVA sponge.

Cleaning conditions are also not particularly limited, and can be appropriately set according to a type of an object to be subjected to surface treatment (polished object) and a type and amount of residues to be removed. For example, the rotation number of a cleaning brush is preferably 10 rpm ($0.17\ s^{-1}$) or more and 200 rpm ($3.33\ s^{-1}$) or less, and the rotation number of an object to be cleaned is preferably 10 rpm ($0.17\ s^{-1}$) or more and 100 rpm ($1.67\ s^{-1}$) or less. A method for supplying the surface treatment composition to a cleaning brush is not particularly limited. For example, a method in which the surface treatment composition is continuously supplied using a pump or the like can be employed (continuously pouring without recycle). A supply amount of the surface treatment composition is not limited, but preferably is such that surfaces of a cleaning brush and an object to be cleaned are always covered with the surface treatment composition. A supply amount is preferably 10 mL/min or more and 5,000 mL/min or less. A cleaning time is also not particularly limited, but is preferably 5 seconds or more and 180 seconds or less in the step of using the surface treatment composition according to an embodiment of the present invention. Within such a range, the foreign substances can be more effectively removed.

A temperature of the surface treatment composition during the cleaning is not particularly limited. The temperature may be usually room temperature, but may be raised to about 40° C. or higher and 70° C. or lower as long as the performance is not impaired.

In the method (ii), conditions of the cleaning method by immersion are not particularly limited, and a known method can be used.

Cleaning with water may be performed before the surface treatment by the method (I) or (II).

(Post-Cleaning Treatment)

In the surface treatment method, it is preferable to further subject a polished object to cleaning treatment after the surface treatment (I) or (II) using the surface treatment composition according to the present invention. In the present description, this cleaning treatment is referred to as "post-cleaning treatment". The post-cleaning treatment is not particularly limited, and examples thereof may include a method of simply pouring water onto the object to be subjected to surface treatment, a method of simply immersing the object to be subjected to surface treatment in water, and the like. Similarly to the surface treatment by the method (II) as described above, examples of the post-cleaning treatment may include a method (brush cleaning) of bringing a cleaning brush into contact with one surface or both surfaces of an object to be subjected to surface treatment while holding the object to be subjected to surface treatment, and rubbing a surface of the object to be subjected to surface treatment with the cleaning brush while supplying water or an aqueous solution (for example, $NH_3$ aqueous solution) to a contact portion therebetween, or supplying water and an aqueous solution (for example, $NH_3$ aqueous solution) to the contact portion in any order (supplying water and then supplying the aqueous solution or supplying the aqueous solution and then supplying water), a method (dip method) of immersing an object to be subjected to surface treatment in water and performing ultrasonic treatment or stirring, and the like. Among these methods, a method of bringing a cleaning brush into contact with one surface or both surfaces of an object to be subjected to surface treatment with the object to be subjected to surface treatment in a held state, and rubbing a surface of the object to be subjected to surface treatment with the cleaning brush while supplying water or an aqueous solution (for example, $NH_3$ aqueous solution) to a contact portion therebetween, or supplying water and an aqueous solution (for example, $NH_3$ aqueous solution) to the contact portion in any order (supplying water and then supplying the aqueous solution or supplying the $NH_3$ aqueous solution and then supplying water) is preferably used. As an apparatus and conditions for the post-cleaning treatment, the description of the surface treatment in (II) described above can be referred to. Here, as water used for the post-cleaning treatment, deionized water is particularly preferably used.

By performing the surface treatment with the surface treatment composition according to an embodiment of the present invention, residues can be extremely easily removed. Therefore, by the surface treatment with the surface treatment composition according to an embodiment of the present invention followed by an additional cleaning treatment using water, the residues can be extremely more favorably removed.

[Method for Producing Semiconductor Substrate]

The surface treatment method according to the present invention can be suitably applied when the polished object is a polished semiconductor substrate. That is, the present invention also is to provide a method for producing a semiconductor substrate, in which a polished object is a polished semiconductor substrate, the method including reducing residues on a surface of the polished semiconductor substrate by the surface treatment method.

The polished object preferably contains a material containing a silicon-silicon bond (silicon material). That is, an embodiment of the present invention also is to provide a method for producing a semiconductor substrate, in which a polished object is a polished semiconductor substrate, the method including: a polishing step of polishing a semiconductor substrate before polishing containing a material containing a silicon-silicon bond (silicon material), using a polishing composition containing an abrasive grain to obtain a polished semiconductor substrate; and a surface treatment step of reducing a residue containing the abrasive grain on a surface of the polished semiconductor substrate while reducing a surface roughness of the polished semiconductor substrate, using the surface treatment composition according to the present invention.

The details of the semiconductor substrate to which such a production method is applied are as described for the polished object which is to be subjected to surface treatment with the surface treatment composition.

In addition, the method for producing a semiconductor substrate is not particularly limited as long as the method includes a step of subjecting a surface of a polished semiconductor substrate to surface treatment using the surface treatment composition according to the present invention (surface treatment step). Examples of such a production method may include a method including a polishing step for forming a polished semiconductor substrate and a cleaning step. Another example is a method including a rinse polishing step between the polishing step and the cleaning step in addition to the polishing step and the cleaning step. Each of these steps will be described below.

<Polishing Step>

The polishing step that can be included in the method for producing a semiconductor substrate is a step of polishing a semiconductor substrate to obtain a polished semiconductor substrate.

The polishing step is not particularly limited as long as it is a step of polishing a semiconductor substrate, but is preferably a chemical mechanical polishing (CMP) step. The polishing step may be a polishing step composed of a single step, or may be a polishing step composed of a plurality of steps. Examples of the polishing step composed of a plurality of steps may include a step of performing a finish polishing step after a preliminary polishing step (rough polishing step), a step of performing one or two or more secondary polishing steps after a primary polishing step and then performing a finish polishing step, and the like. The surface treatment step using the surface treatment composition according to the present invention is preferably performed after the finish polishing step.

As the polishing composition, a known polishing composition can be appropriately used according to characteristics of the semiconductor substrate. The polishing composition is not particularly limited, and examples thereof may include a polishing composition containing abrasive grains, a water-soluble polymer, a pH adjusting agent, and a solvent, and the like.

As the polishing apparatus, a general polishing apparatus can be used that includes a holder for holding an object to be polished, a motor having a changeable rotation number or the like, and a polishing table to which a polishing pad (polishing cloth) can be attached. As a polishing apparatus, either a single-side polishing apparatus or a double-side polishing apparatus may be used.

<Surface Treatment Step>

The surface treatment step refers to a step of reducing residues on a surface of a polished object using the surface treatment composition according to the present invention. In the method for producing a semiconductor substrate, after a rinse polishing step, a cleaning step as a surface treatment step may be performed, or only a rinse polishing step or only a cleaning step may be performed.

(Rinse Polishing Step)

The rinse polishing step may be provided between the polishing step and the cleaning step in the method for producing a semiconductor substrate. The rinse polishing step is a step of reducing foreign substances on a surface of a polished object (polished semiconductor substrate) by the surface treatment method (rinse polishing treatment method) according to an embodiment of the present invention.

Details of the rinse polishing method used in the rinse polishing step are as described in the description regarding the rinse polishing treatment.

(Cleaning Step)

The cleaning step may be provided after the polishing step or may be provided after the rinse polishing step in the method for producing a semiconductor substrate. The cleaning step is a step of reducing foreign substances on a surface of a polished object (polished semiconductor substrate) by the surface treatment method (cleaning method) according to an embodiment of the present invention.

Details of the cleaning method used in the cleaning step are the same as those in the above (post-cleaning treatment).

The present invention encompasses the following aspects and embodiments.

1. A surface treatment composition, containing components (A) to (C) below, wherein pH of the composition is more than 7.0:

the component (A): a cyclic amine compound having a nitrogen-containing non-aromatic heterocyclic ring,
the component (B): a nonionic polymer,
the component (C): a buffer represented by a formula: $A\text{-}COO^{-}NH_4^{+}$ wherein A is an alkyl group having from 1 to 10 carbon atoms, or a phenyl group;

2. The surface treatment composition according to the above 1, wherein the number of nitrogen atoms contained in the cyclic amine compound having a nitrogen-containing non-aromatic heterocyclic ring is 2 or more and 4 or less;
3. The surface treatment composition according to the above 1 or 2, wherein the nonionic polymer contains a nitrogen atom;
4. The surface treatment composition according to the above 1 or 2, wherein the nonionic polymer contains a hydroxy group, and
in the cyclic amine compound having a nitrogen-containing non-aromatic heterocyclic ring, a total of the number of primary nitrogen atoms and the number of secondary nitrogen atoms is 2 or more;
5. The surface treatment composition according to any one of the above 1 to 4, wherein the cyclic amine compound having a nitrogen-containing non-aromatic heterocyclic ring is a piperazine-based compound represented by the Formula (a):
in the Formula (a),
$R^1$ and $R^2$ are each independently a hydrogen atom; a primary amino group; or an alkyl group having from 1 to 10 carbon atoms and optionally substituted with any of primary, secondary and tertiary amino groups;
6. The surface treatment composition according to any one of the above 1 to 5, wherein the nonionic polymer contains at least one selected from the group consisting of polyvinyl alcohol, polyvinylpyrrolidone, polyacrylamide, poly(N-vinylacetamide), polyethylene glycol, hydroxyethyl cellulose, and a butenediol-vinyl alcohol copolymer;
7. The surface treatment composition according to the above 5, wherein the nonionic polymer contains at least one selected from the group consisting of polyvinylpyrrolidone, polyacrylamide, and poly(N-vinylacetamide);
8. The surface treatment composition according to the above 5, wherein the nonionic polymer contains at least one selected from the group consisting of polyvinyl alcohol, polyethylene glycol, hydroxyethyl cellulose, and a butenediol-vinyl alcohol copolymer, and
in the Formula (a), $R^1$ and $R^2$ each independently represent a hydrogen atom; or an alkyl group having from 1 to 3 carbon atoms and substituted with a primary amino group;
9. The surface treatment composition according to any one of the above 1 to 8, wherein the buffer is ammonium acetate;
10. The surface treatment composition according to any one of the above 1 to 9, wherein pH of the surface treatment composition is more than 9.0;
11. The surface treatment composition according to any one of the above 1 to 10, wherein the surface treatment composition contains substantially no abrasive grains;
12. The surface treatment composition according to any one of the above 1 to 11, further containing a component (D):
the component (D): a pH adjusting agent;
13. The surface treatment composition according to the above 12, wherein the pH adjusting agent is ammonia;
14. The surface treatment composition according to the above 12 or 13, wherein the surface treatment composition is substantially composed of the component (A), the component (B), the component (C), the component (D) and water, and at least one selected from the group consisting of an antifungal agent, an organic solvent, a surfactant and a chelating agent;
15. The surface treatment composition according to any one of the above 12 to 14, wherein the surface treatment composition is substantially composed of the component (A), the component (B), the component (C), the component (D) and water, and at least one of an antifungal agent or an organic solvent;
16. The surface treatment composition according to any one of the above 12 to 15, wherein the surface treatment composition is substantially composed of the component (A), the component (B), the component (C), the component (D), and water;
17. A surface treatment method including: subjecting a polished object having a silicon-silicon bond to surface treatment using the surface treatment composition set forth in any one of the above 1 to 16, to reduce a residue on a surface of the polished object while reducing a surface roughness of the polished object;
18. The surface treatment method according to the above 17, wherein the surface treatment is carried out by a rinse polishing treatment method or a cleaning treatment method; and
19. A method for producing a semiconductor substrate, wherein a polished object is a polished semiconductor substrate, the method including:
a polishing step of polishing a semiconductor substrate before polishing having a silicon-silicon bond, using a polishing composition containing an abrasive grain to obtain a polished semiconductor substrate; and
a surface treatment step of reducing a residue containing the abrasive grain on a surface of the polished semiconductor substrate while reducing a surface roughness of the polished semiconductor substrate, using the surface treatment composition set forth in any one of the above 1 to 16.

EXAMPLES

The present invention will be described in more detail with reference to the following Examples and Comparative Examples. However, the technical scope of the present invention is not limited only to the following Examples. Unless otherwise stated, "%" and "part" respectively means "mass %" and "parts by mass". In the following Examples, unless otherwise noted, operations were performed under the conditions of room temperature (25° C.)/relative humidity of 40% RH or more and 50% RH or less.

[Components (A) to (D)]

The following components (A) to (D) were provided.

<Component (A): Cyclic Amine Compound Having Nitrogen-Containing Non-Aromatic Heterocycle>

Aminoethylpiperazine (product name: N-(2-aminoethyl) piperazine, manufactured by Tokyo Chemical Industry Co., Ltd.; molecular weight: 129)

1-Amino-4-methylpiperazine (product name: 1-amino-4-methylpiperazine, manufactured by Tokyo Chemical Industry Co., Ltd.; molecular weight: 115)

1-(2-Dimethylaminoethyl)-4-methylpiperazine (product name: 1-(2-dimethylaminoethyl)-4-methylpiperazine, manufactured by Tokyo Chemical Industry Co., Ltd.; molecular weight: 171)

1-Ethylpiperazine (product name: 1-ethylpiperazine, manufactured by Tokyo Chemical Industry Co., Ltd.); molecular weight: 114)

1,4-Bis(3-aminopropyl)piperazine (product name: 1,4-bis (3-aminopropyl)piperazine, manufactured by Tokyo Chemical Industry Co., Ltd.; molecular weight: 200)

Piperazine anhydrous (product name: piperazine anhydrous, manufactured by FUJIFILM Wako Pure Chemical Corporation; molecular weight: 86).

<Component (A'): Other Amine Compounds>

3-Dimethylamino-1-propanol (product name: 3-(dimethylamino)-1-propanol, manufactured by Tokyo Chemical Industry Co., Ltd.; molecular weight: 103)

N-methylbenzylamine (product name: N-methylbenzylamine, manufactured by Tokyo Chemical Industry Co., Ltd.; molecular weight: 121)

Diglycolamine (2-(2-aminoethoxy)ethanol) (product name: DGA, manufactured by FUJIFILM Wako Pure Chemical Corporation); molecular weight: 105)

Ammonia (product name: EL ammonia water, manufactured by Kanto Chemical Co., Inc.); molecular weight: 17).

<Component (B): Nonionic Polymer>

Polyvinylpyrrolidone (PVP) (product name: PITZCOL (registered trademark) K30A, manufactured by DKS Co. Ltd.; Mw: 45,000)

Polyvinyl alcohol (PVA) (product name JMR (registered trademark)-10HH, manufactured by JAPAN VAM & POVAL Co., Ltd.; Mw: 10,000)

Poly-N-vinylacetamide (PNVA) (product name: GE191-107, manufactured by Showa Denko K.K.); Mw: 50,000).

<Component (C): pH Buffer>

Ammonium acetate (manufactured by Kanto Chemical Co., Inc.); molecular weight: 77).

<Component (C'): Other pH Buffers>

Diammonium hydrogen phosphate (manufactured by FUJIFILM Wako Pure Chemical Corporation); molecular weight: 132)

Ammonium sulfate (manufactured by Kanto Chemical Co., Inc.); molecular weight: 132).

<Component (D): pH Adjusting Agent>

Ammonia (product name: EL ammonia water, manufactured by Kanto Chemical Co., Inc.); molecular weight: 17).

Weight average molecular weights (Mw) of the components (B) and (B') were measured by the following method.

[Measurement of Weight Average Molecular Weight (Mw)]

As the weight average molecular weight (Mw) of the component (B), a value of a weight average molecular weight (in terms of polyethylene glycol) measured by gel permeation chromatography (GPC) was used. The weight average molecular weight was measured with the following apparatus under the following conditions:

GPC apparatus: manufactured by Shimadzu Corporation

Model: Prominence+ELSD detector (ELSD-LTII)

Column: VP-ODS (manufactured by Shimadzu Corporation)

Mobile phase A: MeOH

B: 1% acetic acid aqueous solution

Flow rate: 1 mL/min

Detector: ELSD temp. 40° C., Gain 8, N2 GAS 350 kPa

Oven temperature: 40° C.

Injection volume: 40 μL

[Measurement of pH of Surface Treatment Composition]

pH of a surface treatment composition (liquid temperature: 25° C.) was confirmed by a pH meter (manufactured by HORIBA, Ltd., product name: LAQUA (registered trademark)). pH of a polishing composition described below was also measured by the same method.

[Preparation of Surface Treatment Composition]

Example 1

A surface treatment composition 1 was prepared by stirring and mixing aminoethylpiperazine as the component (A), polyvinylpyrrolidone (Mw: 45,000) as the component (B), ammonium acetate as the component (C), ammonia as the component (D), and distilled water as the solvent at 25° C. for 5 minutes.

Here, content of each component was as follows.

In this example, a content of the component (A) was 0.03 mass % (0.3 g/L), a content of the component (B) was 0.06 mass % (0.6 g/L), a content of the component (C) was 0.03 mass % (0.3 g/L), with respect to the total amount of the surface treatment composition 1, and a content of the component (D) (pH adjusting agent) was set to an amount such that pH of the surface treatment composition 1 was 10.5.

Examples 2 to 20, Comparative Examples 1 to 11

Surface treatment compositions 2 to 31 were prepared in the same manner as in Example 1 except that the components (A)/(A'), the component (B), the components (C)/(C'), the component (D) and the pH were each changed as shown in Table 1. In Table 1, "-" indicates that the corresponding component was not added.

Comparative Example 12

As described later, the surface of each substrate prepared without performing the rinse polishing treatment using the surface treatment composition was evaluated for Comparative Example 12.

The surface treatment compositions 1 to 31 prepared above do not contain abrasive grains (content of abrasive grains: 0 mass %). In addition, in the following Table 1, in the item of "N atom type", whether the nitrogen atom contained in the component (A) or (A') is a primary nitrogen atom, a secondary nitrogen atom, or a tertiary nitrogen atom is indicated by a number. A nitrogen atom that is not bonded to a carbon atom is described as "0" for convenience.

TABLE 1

| | | Component (A) | | | | Component (B) | | | Component (C) | | Component (D) | |
|---|---|---|---|---|---|---|---|---|---|---|---|---|
| | Substrate No. | Compound | Molecular weight | N atom type | Content [mass %] | Compound | Molecular weight | Content [mass %] | Buffer | Content [mass %] | pH adjusting agent | pH [-] |
| Example 1 | 1 | Aminoethylpiperazine (AEP) | 129 | 1, 2, 3 | 0.03 | PVP | 45,000 | 0.06 | Ammonium acetate | 0.03 | Ammonia | 10.5 |

TABLE 1-continued

| | Sub-strate No. | Component (A) Compound | Mo-lecular weight | N atom type | Content [mass %] | Component (B) Com-pound | Mo-lecular weight | Content [mass %] | Component (C) Buffer | Content [mass %] | Component (D) pH adjusting agent | pH [-] |
|---|---|---|---|---|---|---|---|---|---|---|---|---|
| Example 2 | 2 | Aminoethylpiperazine (AEP) | 129 | 1, 2, 3 | 0.03 | PVP | 45,000 | 0.06 | Ammonium acetate | 0.03 | Ammonia | 9.2 |
| Example 5 | 5 | Aminoethylpiperazine (AEP) | 129 | 1, 2, 3 | 0.03 | PNVA | 50,000 | 0.06 | Ammonium acetate | 0.03 | Ammonia | 9.2 |
| Example 6 | 6 | 1-Amino-4-methylpiperazine | 115 | 0, 2, 3 | 0.03 | PVP | 45,000 | 0.06 | Ammonium acetate | 0.03 | Ammonia | 9.2 |
| Example 7 | 7 | 1-(2-Dimethylaminoethyl)-4-methylpiperazine | 171 | 3, 3, 3 | 0.03 | PVP | 45,000 | 0.06 | Ammonium acetate | 0.03 | Ammonia | 9.2 |
| Example 8 | 8 | 1-Ethylpiperazine | 114 | 2, 3 | 0.03 | PVP | 45,000 | 0.06 | Ammonium acetate | 0.03 | Ammonia | 9.2 |
| Example 9 | 9 | 1,4-Bis(3-aminopropyl)piperazine | 200 | 1, 1, 3, 3 | 0.03 | PVP | 45,000 | 0.06 | Ammonium acetate | 0.03 | Ammonia | 9.2 |
| Example 10 | 10 | Piperazine anhydrous | 86 | 2, 2 | 0.03 | PVP | 45,000 | 0.06 | Ammonium acetate | 0.03 | Ammonia | 9.2 |

| | Sub-strate No. | Component (A) Compound | Mo-lecular weight | N atom type | Content [mass %] | Component (B) Com-pound | Mo-lecular weight | Content [mass %] | Component (C) Buffer | Content [mass %] | Component (D) pH adjusting agent | pH [-] |
|---|---|---|---|---|---|---|---|---|---|---|---|---|
| Example 3 | 3 | Aminoethylpiperazine (AEP) | 129 | 1, 2, 3 | 0.03 | PVA | 10,000 | 0.06 | Ammonium acetate | 0.03 | Ammonia | 10.5 |
| Example 4 | 4 | Aminoethylpiperazine (AEP) | 129 | 1, 2, 3 | 0.03 | PVA | 10,000 | 0.06 | Ammonium acetate | 0.03 | Ammonia | 9.2 |
| Example 11 | 11 | 1-Amino-4-methylpiperazine | 115 | 0, 2, 3 | 0.03 | PVA | 10,000 | 0.06 | Ammonium acetate | 0.03 | Ammonia | 10.5 |
| Example 12 | 12 | 1-Amino-4-methylpiperazine | 115 | 0, 2, 3 | 0.03 | PVA | 10,000 | 0.06 | Ammonium acetate | 0.03 | Ammonia | 9.2 |
| Example 13 | 13 | 1-(2-Dimethylaminoethyl)-4-methylpiperazine | 171 | 3, 3, 3 | 0.03 | PVA | 10,000 | 0.06 | Ammonium acetate | 0.03 | Ammonia | 10.5 |
| Example 14 | 14 | 1-(2-Dimethylaminoethyl)-4-methylpiperazine | 171 | 3, 3, 3 | 0.03 | PVA | 10,000 | 0.06 | Ammonium acetate | 0.03 | Ammonia | 9.2 |
| Example 15 | 15 | 1-Ethylpiperazine | 114 | 2, 3 | 0.03 | PVA | 10,000 | 0.06 | Ammonium acetate | 0.03 | Ammonia | 10.5 |
| Example 16 | 16 | 1-Ethylpiperazine | 114 | 2, 3 | 0.03 | PVA | 10,000 | 0.06 | Ammonium acetate | 0.03 | Ammonia | 9.2 |
| Example 17 | 17 | 1,4-Bis(3-aminopropyl)piperazine | 200 | 1, 1, 3, 3 | 0.03 | PVA | 10,000 | 0.06 | Ammonium acetate | 0.03 | Ammonia | 10.5 |
| Example 18 | 18 | 1,4-Bis(3-aminopropyl)piperazine | 200 | 1, 1, 3, 3 | 0.03 | PVA | 10,000 | 0.06 | Ammonium acetate | 0.03 | Ammonia | 9.2 |
| Example 19 | 19 | Piperazine anhydrous | 86 | 2, 2 | 0.03 | PVA | 10,000 | 0.06 | Ammonium acetate | 0.03 | Ammonia | 10.5 |
| Example 20 | 20 | Piperazine anhydrous | 86 | 2, 2 | 0.03 | PVA | 10,000 | 0.06 | Ammonium acetate | 0.03 | Ammonia | 9.2 |

| | Sub-strate No. | Component (A) or (A') Compound | Mo-lecular weight | N atom type | Content [mass %] | Component (B) Com-pound | Mo-lecular weight | Content [mass %] | Component (C) or (C') Buffer | Content [mass %] | Component (D) pH adjusting agent | pH [-] |
|---|---|---|---|---|---|---|---|---|---|---|---|---|
| Comparative Example 1 | 21 | 3-Dimethylamino-1-propanol | 103 | 3 | 0.03 | PVA | 10,000 | 0.06 | Ammonium acetate | 0.03 | Ammonia | 9.2 |
| Comparative Example 2 | 22 | N-methylbenzylamine | 121 | 2 | 0.03 | PVA | 10,000 | 0.06 | Ammonium acetate | 0.03 | Ammonia | 9.2 |
| Comparative Example 3 | 23 | Diglycolamine (2-(2-aminoethoxy)ethanol) | 105 | 1 | 0.03 | PVA | 10,000 | 0.06 | Ammonium acetate | 0.03 | Ammonia | 9.2 |
| Comparative Example 4 | 24 | Ammonia | 17 | — | 0.01 | PVA | 10,000 | 0.06 | Ammonium acetate | 0.03 | — | 9.2 |
| Comparative Example 5 | 25 | Ammonia | 17 | — | 0.11 | PVA | 10,000 | 0.06 | Ammonium acetate | 0.03 | — | 10.5 |
| Comparative Example 6 | 26 | Ammonia | 17 | — | 0.01 | — | — | — | Ammonium acetate | 0.03 | — | 9.2 |
| Comparative Example 7 | 27 | Ammonia | 17 | — | 0.01 | PVP | 45,000 | 0.06 | Ammonium acetate | 0.03 | — | 9.2 |
| Comparative Example 8 | 28 | Ammonia | 17 | — | 0.11 | PVP | 45,000 | 0.06 | Ammonium acetate | 0.03 | — | 10.5 |

TABLE 1-continued

| | | | | | | | | | | | | |
|---|---|---|---|---|---|---|---|---|---|---|---|---|
| Comparative Example 9 | 29 | Aminoethylpiperazine (AEP) | 129 | 1, 2, 3 | 0.03 | — | — | — | Ammonium acetate | 0.03 | Ammonia | 9.2 |
| Comparative Example 10 | 30 | Aminoethylpiperazine (AEP) | 129 | 1, 2, 3 | 0.03 | PVP | 45,000 | 0.06 | Diammonium hydrogen phosphate | 0.03 | Ammonia | 9.2 |
| Comparative Example 11 | 31 | Aminoethylpiperazine (AEP) | 129 | 1, 2, 3 | 0.03 | PVP | 45,000 | 0.06 | Ammonium sulfate | 0.03 | Ammonia | 9.2 |
| Comparative Example 12 | 32 | — | — | — | — | — | — | — | — | — | — | — |

[Preparation of Polished Object]

Polished objects (polished polysilicon substrate, polished amorphous silicon substrate, and polished single-crystalline silicon substrate) after being polished by the following chemical mechanical polishing (CMP) step were provided.

(CMP Step)

As objects to be polished, a silicon wafer (polysilicon substrate) (300 mm wafer, manufactured by Advanced Materials Technology, Inc.) having a polycrystalline silicon film with a thickness of 5,000 Å formed on the surface thereof by CVD, a silicon wafer (amorphous silicon substrate) (300 mm wafer, manufactured by Advanced Materials Technology) having an amorphous silicon film with a thickness of 2,000 Å formed on the surface thereof by CVD, and a silicon wafer (single-crystalline silicon substrate) (300 mm wafer, p-type, crystal orientation <100>, COP free) were provided. Here, the COP (Crystal Originated Particle) is a concave defect formed on a surface of a silicon wafer, and is caused by a crystal defect of single-crystalline silicon forming the silicon wafer or a scratch that has a width and depth exceeding a predetermined width and depth and formed due to a polishing material (abrasive grains).

The polysilicon substrate, the amorphous silicon substrate, and the single-crystalline silicon substrate prepared above were polished under the following conditions using a polishing composition having the following composition, to obtain polished objects (polished polysilicon substrates, polished amorphous silicon substrates, and polished single-crystalline silicon substrates).

<Polishing Composition>

First, a silica slurry having the following composition was prepared:

- Colloidal silica (average primary particle size: 35 nm, average secondary particle size: 70 nm) 10 mass %
- Polyvinylpyrrolidone (product name: PITZCOL (registered trademark) K30A, manufactured by DKS Co. Ltd.; Mw: 45,000) 0.25 mass %
- Ammonia (product name: EL ammonia water ($NH_3$ concentration: 28.0% to 30.0%) manufactured by Kanto Chemical Co., Inc.) 0.33 mass % (as NH 3)
- Solvent: distilled water.

Then, the silica slurry was diluted 5-times with distilled water to prepare a polishing composition. pH of the obtained polishing composition was 10.0.

<Polishing Apparatus and Polishing Conditions>

- Polishing apparatus: F-REX300E manufactured by Ebara Corporation
- Polishing pad: Foamed polyurethane pad manufactured by Fujibo Holdings Inc., H800-Type 1
- Conditioner (dresser): Nylon brush (manufactured by 3M Company)
- Polishing pressure: 2.0 psi (1 psi=6894.76 Pa, the same applies hereinafter)
- Rotation number of polishing table: 80 rpm
- Rotation number of head: 80 rpm
- Supply of polishing composition: Continuously pouring without recycle
- Supply amount of polishing composition: 200 mL/min
- Polishing time: 30 seconds

[Rinse Polishing Treatment]

After each surface of the object to be polished (polysilicon substrate, amorphous silicon substrate, and single-crystalline silicon substrate) was polished in the CMP step, the polished object (polished polysilicon substrate, polished amorphous silicon substrate, and polished single-crystalline silicon substrate) was removed from the polishing table (platen). Subsequently, the polished object was mounted on another polishing table (platen) in the same polishing apparatus. Rinse polishing treatment was performed on a surface of the polished object using each of the surface treatment compositions 1 to 31 prepared in Examples and Comparative Examples under the following conditions.

<Rinse Polishing Apparatus and Rinse Polishing Conditions>

- Polishing apparatus: F-REX300E manufactured by Ebara Corporation
- Polishing pad: Foamed polyurethane pad manufactured by Fujibo Holdings Inc., H800-Type 1
- Conditioner (dresser): Nylon brush (manufactured by 3M Company)
- Polishing pressure: 1.0 psi
- Rotation number of table: 80 rpm
- Rotation number of head: 80 rpm
- Supply of surface treatment composition: Continuously pouring without recycle
- Supply amount of surface treatment composition: 300 mL/min
- Polishing time: 60 seconds

[Post-Cleaning Treatment]

After the rinse polishing treatment, a surface of the substrate was cleaned with a brush for 20 seconds using a 0.3% $NH_3$ aqueous solution, and then cleaned with deionized water for 40 seconds, to obtain a rinse-polished object (rinse-polished polysilicon substrates 1 to 31 obtained by using the surface treatment compositions 1 to 31 of Examples and Comparative Examples, rinse-polished amorphous silicon substrates 1 to 31 obtained by using the surface treatment compositions 1 to 31 of Examples and Comparative Examples, and rinse-polished single-crystalline silicon substrates 1 to 31 obtained by using the surface treatment compositions 1 to 31 of Examples and Comparative Examples). As Comparative Example 12, after the CMP step was performed on each substrate, the post-cleaning treatment was performed without performing rinse polishing treatment (treatment with the surface treatment composition), to obtain each of a polysilicon substrate 32, an amorphous silicon substrate 32, and a single-crystalline silicon substrate 32.

[Evaluation]

(Evaluation of Wettability (Contact Angle))

A polished object (polished polysilicon substrate, polished amorphous silicon substrate, and polished single-crystalline silicon substrate) was prepared in the same manner as in the method described in the above section of [Preparation of polished object]. Subsequently, the polished object was mounted on a polishing table (platen) in the following polishing apparatus. Rinse polishing treatment was performed on a surface of the polished object using each of the surface treatment compositions 1 to 10 and 21 to 31 prepared in Examples and Comparative Examples under the following conditions.

<Rinse Polishing Apparatus and Rinse Polishing Conditions (for Wettability Evaluation)>

Polishing apparatus: Lapping machine EJ-380IN-CH, manufactured by Engis Japan Corporation.

Polishing pad: Foamed polyurethane pad, manufactured by Fujibo Holdings Inc.

H800-Type 1

Conditioner (dresser): Nylon brush (manufactured by 3M Company)

Polishing pressure: 1.0 psi

Rotation number of polishing table: 80 rpm

Rotation number of head: 80 rpm

Supply of polishing composition: Continuously pouring without recycle

Supply amount of surface treatment composition: 100 mL/min

Polishing time: 60 seconds

After the rinse polishing treatment was performed as described above, rinse-polished objects (rinse-polished polysilicon substrates 1' to 10' and 21' to 31', rinse-polished amorphous silicon substrates 1' to 10' and 21' to 31', and rinse-polished single-crystalline silicon substrates 1' to 10' and 21' to 31') and a polysilicon substrate 32', an amorphous silicon substrate 32', and a single-crystalline silicon substrate 32' as Comparative Example 12 were obtained without performing the post-cleaning treatment. Moisture on a surface of each rinse-polished object and each substrate 32' as Comparative Example 12 was removed by air shower, and then the water contact angle was measured by the θ/2 method. A wafer cleanness and treatment analyzer CA-X200, manufactured by Kyowa Interface Science Co., Ltd. was used for the measurement.

As described above, it is presumed that when the surface treatment composition according to the present invention is used, the component (A) (and the component (B)) is adsorbed to a surface of a substrate, thereby promoting etching of the surface of the substrate, and at the same time, the component (A) acts like a protective film on the surface of the substrate to suppress local etching, so that the surface roughness can be reduced. Here, the fact that water contact angle of a surface of a substrate is small indicates that the wettability of the surface is high, and this is presumably attributable to improvement in hydrophilicity as a result of a nitrogen atom portion of the component (A) adsorbing to the surface of the substrate. Therefore, it is considered that the fact that the surface of the substrate exhibits high wettability supports that the component (A) acts as in the above mechanism.

(Measurement of Surface Roughness (Ra, Arithmetic Average Roughness))

The surface roughness (Ra) of each of the rinse-polished objects (rinse-polished polysilicon substrates 1 to 31, rinse-polished amorphous silicon substrates 1 to 31, and rinse-polished single-crystalline silicon substrates 1 to 31) and the polysilicon substrate 32, the amorphous silicon substrate 32, and the single-crystalline silicon substrate 32 as Comparative Example 12 was evaluated using an atomic force microscope (automated atomic force profiler InSight CAP, manufactured by Bruker Japan Ltd.). Specifically, a 5 mm-square region on the substrate was scanned with the atomic force microscope, and the surface roughness (Ra) of the substrate was measured. This measurement was performed at five points on the substrate, and the average value of the measurements was confirmed.

The surface roughness (Ra) is preferably as small as possible. As an example, in the polysilicon substrate, the surface roughness (Ra) is acceptable as long as it is less than 0.27 nm, and is preferably 0.25 nm or less, and more preferably less than 0.25 nm. In the amorphous silicon substrate, the surface roughness (Ra) is acceptable as long as it is less than 0.23 nm, and is preferably 0.20 nm or less, and more preferably 0.18 nm or less. In the single-crystalline silicon substrate, the surface roughness (Ra) is acceptable as long as it is less than 0.24 nm, and is preferably 0.23 nm or less, and more preferably 0.21 nm or less.

(Residue Evaluation)

The number of residues on the surface of each of the rinse-polished objects (rinse-polished polysilicon substrates 1 to 31, rinse-polished amorphous silicon substrates 1 to 31, and rinse-polished single-crystalline silicon substrates 1 to 31) and the polysilicon substrate 32, the amorphous silicon substrate 32, and the single-crystalline silicon substrate 32 as Comparative Example 12 was evaluated using an optical inspection machine Surfscan (registered trademark) SP5, manufactured by KLA Corporation.

Specifically, the number of residues having a diameter of more than 70 nm was counted for a remaining portion excluding a portion having a width of 5 mm from the outer peripheral end portion (a region from 0 mm to 5 mm when the outer peripheral end is 0 mm) of one surface of the polysilicon substrate (rinse-polished polysilicon substrate). Thereafter, the number of abrasive grain residues and the number of organic residues were measured for the polysilicon substrate (rinse-polished polysilicon substrate) by SEM observation using Review SEM RS6000, manufactured by Hitachi High-Tech Corporation. First, 100 residues existing in the remaining portion excluding the portion having a width of 5 mm from the outer peripheral end portion of one surface of the polysilicon substrate (rinse-polished polysilicon substrate) were sampled by SEM observation. Next, the type of residue (abrasive grain or organic residue) was determined by visual SEM observation from among the sampled 100 residues. Then, the number of abrasive grain residues ($SiO_2$ residues) and the number of organic residues (pad debris, polymer(s), and the like) were respectively measured.

The number of residues on the surface of each of the amorphous silicon substrate (rinse-polished amorphous silicon substrate) and the single-crystalline silicon substrate (rinse-polished single-crystalline silicon substrate) was evaluated in the same manner as described above. The number of residues having a diameter of more than 70 nm was counted for the amorphous silicon substrate (rinse-polished amorphous silicon substrate), and the number of residues having a diameter of more than 50 nm was counted for the single-crystalline silicon substrate (rinse-polished single-crystalline silicon substrate).

The number of abrasive grain residues ($SiO_2$ residues) is preferably as small as possible. As an example, in the polysilicon substrate, the number of abrasive grain residues ($SiO_2$ residues) is acceptable as long as it is 20 or less, preferably 15 or less, and more preferably 10 or less. In the amorphous silicon substrate, the number of abrasive grain residues is acceptable as long as it is 15 or less, preferably 10 or less, and more preferably 5 or less. In the single-crystalline silicon substrate, the number of abrasive grain residues is acceptable as long as it is 100 or less, preferably 80 or less, and more preferably 70 or less.

In addition, the number of organic residues (pad debris, polymer(s), and the like) is also preferably as small as possible. As an example, in the polysilicon substrate, the number of organic residues (pad debris, polymer(s), and the like) is acceptable as long as it is 30 or less, preferably 25 or less, and more preferably less than 25. In the amorphous silicon substrate, the number of organic residues is acceptable as long as it is 50 or less, preferably 45 or less, and more preferably 35 or less. In the single-crystalline silicon substrate, the number of organic residues is acceptable as long as it is less than 70, and preferably 60 or less, and more preferably 55 or less.

(Measurement of Adsorption Amount by QCM Method)

The amount of adsorption of components contained in the surface treatment composition to a surface of gold (Au) (also referred to as adsorption amount) was measured by a quartz crystal microbalance method (QCM method). A QCM-D measuring apparatus Q-Sense-Pro (manufactured by Altech Co., Ltd.) was used for the measurement. As the electrode, an Au electrode was used because it has a hydrophobic surface as with polysilicon or the like.

The measurement procedure is as follows.

First, 180 μL of pure water was set in the measuring apparatus and the temperature was stabilized at 25° C. Thereafter, each surface treatment composition was caused to flow at a flow rate of 20 μL/min for 5 minutes. The amount of adsorption of the components contained in the surface treatment composition to the surface of the Au electrode (the total adsorption amount of the components (A) and (B)) was measured.

As described above, it is presumed that, when the surface treatment composition according to the present invention is used, the components (A) and (B) are adsorbed to a surface of a substrate, thereby providing the effect of reducing the surface roughness and the effect of reducing residues. Here, the fact that the amount of adsorption of the components contained in the surface treatment composition to the surface of Au, as a model of a hydrophobic surface, is large indicates that the component (A) or (B) is easily adsorbed to a surface of a substrate. Therefore, it is considered that exhibiting a large numerical value in the measurement of the adsorption amount supports that the components (A) and (B) act as in the above mechanism.

The results of the above evaluations are shown in Table 2 below. Note that a substrate for which the contact angle was not evaluated is described as "-" in Table 2.

TABLE 2

| | | | Polysilicon (Poly-Si) | | | | | Amorphous silicon (Amorphous-Si) | | | | | Single-crystalline silicon (Bare-Si) | | | | |
|---|---|---|---|---|---|---|---|---|---|---|---|---|---|---|---|---|---|
| | | | | | Number of defects | | | | | Number of defects | | | | | Number of defects | | |
| | Substrate No. | Adsorption amount measurement [ng/cm$^2$] | Contact angle [°] | Surface roughness (Ra) [nm] | Total number [count] | Abrasive grain residue [count] | Organic residue [count] | Contact angle [°] | Surface roughness (Ra) [nm] | Total number [count] | Abrasive grain residue [count] | Organic residue [count] | Contact angle [°] | Surface roughness (Ra) [nm] | Total number [count] | Abrasive grain residue [count] | Organic residue [count] |
| Example 1 | 1 | 182 | 10 | 0.25 | 26 | 7 | 19 | 10 | 0.16 | 28 | 3 | 25 | 10 | 0.20 | 87 | 50 | 37 |
| Example 2 | 2 | 188 | 10 | 0.19 | 29 | 9 | 20 | 11 | 0.16 | 33 | 3 | 30 | 10 | 0.20 | 95 | 55 | 40 |
| Example 5 | 5 | 192 | 12 | 0.22 | 33 | 11 | 22 | 12 | 0.19 | 47 | 5 | 42 | 12 | 0.20 | 137 | 78 | 59 |
| Example 6 | 6 | 188 | 11 | 0.20 | 33 | 11 | 22 | 10 | 0.17 | 40 | 5 | 35 | 11 | 0.20 | 100 | 57 | 43 |
| Example 7 | 7 | 179 | 28 | 0.21 | 33 | 11 | 22 | 15 | 0.18 | 41 | 5 | 36 | 28 | 0.20 | 102 | 59 | 43 |
| Example 8 | 8 | 191 | 14 | 0.22 | 39 | 14 | 25 | 14 | 0.17 | 45 | 7 | 38 | 14 | 0.20 | 115 | 60 | 55 |
| Example 9 | 9 | 183 | 15 | 0.23 | 38 | 13 | 25 | 13 | 0.19 | 47 | 7 | 40 | 15 | 0.20 | 114 | 63 | 51 |
| Example 10 | 10 | 185 | 13 | 0.22 | 39 | 14 | 25 | 13 | 0.16 | 49 | 9 | 40 | 15 | 0.20 | 115 | 63 | 52 |

| | | | Polysilicon (Poly-Si) | | | | | Amorphous silicon (Amorphous-Si) | | | | | Single-crystalline silicon (Bare-Si) | | | | |
|---|---|---|---|---|---|---|---|---|---|---|---|---|---|---|---|---|---|
| | | | | | Number of defects | | | | | Number of defects | | | | | Number of defects | | |
| | Substrate No. | Adsorption amount measurement [ng/cm$^2$] | Contact angle [°] | Surface roughness (Ra) [nm] | Total number [count] | Abrasive grain residue [count] | Organic residue [count] | Contact angle [°] | Surface roughness (Ra) [nm] | Total number [count] | Abrasive grain residue [count] | Organic residue [count] | Contact angle [°] | Surface roughness (Ra) [nm] | Total number [count] | Abrasive grain residue [count] | Organic residue [count] |
| Example 3 | 3 | 202 | 11 | 0.25 | 29 | 8 | 21 | 11 | 0.15 | 44 | 4 | 40 | 11 | 0.20 | 120 | 68 | 52 |
| Example 4 | 4 | 200 | 11 | 0.21 | 34 | 10 | 24 | 11 | 0.17 | 47 | 4 | 43 | 11 | 0.20 | 129 | 72 | 57 |
| Example 11 | 11 | 177 | — | 0.20 | 42 | 14 | 28 | — | 0.15 | 52 | 6 | 46 | — | 0.20 | 136 | 71 | 65 |
| Example 12 | 12 | 169 | — | 0.22 | 45 | 18 | 27 | — | 0.16 | 54 | 6 | 48 | — | 0.20 | 139 | 72 | 67 |
| Example 13 | 13 | 115 | — | 0.22 | 43 | 14 | 29 | — | 0.16 | 57 | 7 | 50 | — | 0.20 | 144 | 79 | 65 |
| Example 14 | 14 | 117 | — | 0.19 | 49 | 18 | 31 | — | 0.17 | 58 | 9 | 49 | — | 0.20 | 146 | 77 | 69 |
| Example 15 | 15 | 163 | — | 0.21 | 41 | 13 | 28 | — | 0.17 | 53 | 6 | 47 | — | 0.20 | 136 | 70 | 66 |
| Example 16 | 16 | 154 | — | 0.23 | 45 | 15 | 30 | — | 0.17 | 57 | 7 | 50 | — | 0.20 | 139 | 72 | 67 |

TABLE 2-continued

| | | | | | | | | | | | | | | | | |
|---|---|---|---|---|---|---|---|---|---|---|---|---|---|---|---|---|
| Example 17 | 17 | 291 | — | 0.24 | 31 | 9 | 22 | — | 0.16 | 47 | 4 | 43 | — | 0.20 | 127 | 69 | 58 |
| Example 18 | 18 | 277 | — | 0.20 | 38 | 11 | 27 | — | 0.16 | 49 | 4 | 45 | — | 0.20 | 132 | 73 | 59 |
| Example 19 | 19 | 245 | — | 0.23 | 36 | 13 | 23 | — | 0.16 | 51 | 7 | 44 | — | 0.20 | 130 | 68 | 62 |
| Example 20 | 20 | 236 | — | 0.22 | 39 | 13 | 26 | — | 0.16 | 53 | 8 | 45 | — | 0.20 | 135 | 66 | 69 |

| | | Polysilicon (Poly-Si) | | | | | Amorphous silicon (Amorphous-Si) | | | | | Single-crystalline silicon (Bare-Si) | | | | |
|---|---|---|---|---|---|---|---|---|---|---|---|---|---|---|---|---|
| | | | | Number of defects | | | | | Number of defects | | | | | Number of defects | | |
| | Substrate No. | Contact angle [°] | Surface roughness (Ra) [nm] | Total number [count] | Abrasive grain residue [count] | Organic residue [count] | Contact angle [°] | Surface roughness (Ra) [nm] | Total number [count] | Abrasive grain residue [count] | Organic residue [count] | Contact angle [°] | Surface roughness (Ra) [nm] | Total number [count] | Abrasive grain residue [count] | Organic residue [count] |
| Comparative Example 1 | 21 | 28 | 0.29 | 60 | 24 | 36 | 35 | 0.29 | 90 | 20 | 70 | 28 | 0.24 | 199 | 120 | 79 |
| Comparative Example 2 | 22 | 29 | 0.28 | 58 | 23 | 35 | 33 | 0.29 | 105 | 25 | 80 | 29 | 0.24 | 208 | 128 | 80 |
| Comparative Example 3 | 23 | 28 | 0.30 | 65 | 25 | 40 | 38 | 0.26 | 108 | 25 | 83 | 28 | 0.25 | 216 | 135 | 81 |
| Comparative Example 4 | 24 | 26 | 0.27 | 74 | 30 | 44 | 20 | 0.26 | 106 | 25 | 81 | 26 | 0.24 | 228 | 145 | 83 |
| Comparative Example 5 | 25 | 25 | 0.30 | 90 | 45 | 45 | 24 | 0.24 | 114 | 28 | 86 | 25 | 0.25 | 253 | 168 | 85 |
| Comparative Example 6 | 26 | 50 | 0.35 | 155 | 95 | 60 | 44 | 0.23 | 280 | 90 | 190 | 70 | 0.35 | 350 | 250 | 100 |
| Comparative Example 7 | 27 | 18 | 0.27 | 65 | 25 | 40 | 19 | 0.25 | 98 | 23 | 75 | 18 | 0.26 | 205 | 135 | 70 |
| Comparative Example 8 | 28 | 18 | 0.30 | 80 | 35 | 45 | 18 | 0.27 | 105 | 25 | 80 | 18 | 0.27 | 230 | 150 | 80 |
| Comparative Example 9 | 29 | 50 | 0.33 | 130 | 80 | 50 | 49 | 0.30 | 265 | 85 | 180 | 70 | 0.34 | 320 | 230 | 90 |

TABLE 2-continued

| | | | | | | | | | | | | | | | | |
|---|---|---|---|---|---|---|---|---|---|---|---|---|---|---|---|---|
| Comparative Example 10 | 30 | 26 | 0.29 | 60 | 25 | 35 | 25 | 0.32 | 95 | 23 | 72 | 26 | 0.24 | 204 | 123 | 81 |
| Comparative Example 11 | 31 | 26 | 0.29 | 57 | 23 | 34 | 21 | 0.29 | 92 | 21 | 71 | 26 | 0.24 | 198 | 121 | 77 |
| Comparative Example 12 | 32 | 60 | 0.33 | 180 | 110 | 70 | 50 | 0.31 | 295 | 100 | 195 | 70 | 0.34 | 380 | 270 | 110 |

As is apparent from Table 2 above, the surface roughness of a polysilicon substrate, an amorphous silicon substrate, and a single-crystalline silicon substrate can be reduced by the surface treatment compositions of Examples, as compared with the surface treatment compositions of Comparative Examples. In addition, it is found that residues on a polysilicon substrate, an amorphous silicon substrate, and a single-crystalline silicon substrate can be sufficiently removed by the surface treatment compositions of Examples.

They are results of evaluation immediately after the production of the surface treatment composition, but the surface treatment composition preferably contains an antifungal agent (antiseptic agent) when the composition is preserved or stored for a long period of time. Since an antifungal agent (antiseptic agent) hardly affects or does not affect the results, the same results as above are considered to be obtained for surface treatment compositions containing an antifungal agent (antiseptic agent).

What is claimed is:

1. A surface treatment composition, comprising components (A) to (C), wherein pH of the composition is more than 7.0:

the component (A): a cyclic amine compound having a nitrogen-containing non-aromatic heterocyclic ring, the component (B): a nonionic polymer, the component (C): a buffer represented by a formula: $A\text{-}COO^{-}NH_4^{+}$ wherein A is an alkyl group having from 1 to 10 carbon atoms.

2. The surface treatment composition according to claim 1, wherein the number of nitrogen atoms contained in the cyclic amine compound having a nitrogen-containing non-aromatic heterocyclic ring is 2 or more and 4 or less.

3. The surface treatment composition according to claim 1, wherein the nonionic polymer contains a nitrogen atom.

4. The surface treatment composition according to claim 1, wherein the nonionic polymer contains a hydroxy group, and in the cyclic amine compound having a nitrogen-containing non-aromatic heterocyclic ring, a total of the number of primary nitrogen atoms and the number of secondary nitrogen atoms is 2 or more.

5. The surface treatment composition according to claim 2, wherein the cyclic amine compound having a nitrogen-containing non-aromatic heterocyclic ring is a piperazine-based compound represented by Formula (a):

(a)

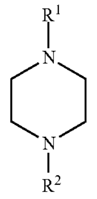

in the Formula (a), $R^1$ and $R^2$ are each independently a hydrogen atom; a primary amino group; or an alkyl group having from 1 to 10 carbon atoms and optionally substituted with any of primary, secondary and tertiary amino groups.

6. The surface treatment composition according to claim 1, wherein the nonionic polymer contains at least one selected from the group consisting of polyvinyl alcohol, polyvinylpyrrolidone, polyacrylamide, poly(N-vinylacetamide), polyethylene glycol, hydroxyethyl cellulose, and a butenediol-vinyl alcohol copolymer.

7. The surface treatment composition according to claim 5, wherein the nonionic polymer contains at least one selected from the group consisting of polyvinylpyrrolidone, polyacrylamide, and poly(N-vinylacetamide).

8. The surface treatment composition according to claim 5, wherein the nonionic polymer contains at least one selected from the group consisting of polyvinyl alcohol, polyethylene glycol, hydroxyethyl cellulose, and a butenediol-vinyl alcohol copolymer, and in the Formula (a), $R^1$ and $R^2$ each independently represent a hydrogen atom; or an alkyl group having from 1 to 3 carbon atoms and substituted with a primary amino group.

9. The surface treatment composition according to claim 1, wherein the buffer is ammonium acetate.

10. The surface treatment composition according to claim 1, wherein pH of the surface treatment composition is more than 9.0.

11. The surface treatment composition according to claim 1, wherein the surface treatment composition contains substantially no abrasive grains.

12. The surface treatment composition according to claim 1, further comprising a component (D):

the component (D): a pH adjusting agent.

13. The surface treatment composition according to claim 12, wherein the pH adjusting agent is ammonia.

14. A surface treatment method comprising: subjecting a polished object having a silicon-silicon bond to surface treatment using the surface treatment composition set forth in claim 1, to reduce a residue on a surface of the polished object while reducing a surface roughness of the polished object.

15. The surface treatment method according to claim 14, wherein the surface treatment is carried out by a rinse polishing treatment method or a cleaning treatment method.

16. A method for producing a semiconductor substrate, wherein a polished object is a polished semiconductor substrate, the method comprising:

polishing a semiconductor substrate before polishing having a silicon-silicon bond, using a polishing composition containing an abrasive grain to obtain a polished semiconductor substrate; and reducing a residue containing the abrasive grain on a surface of the polished semiconductor substrate while reducing a surface roughness of the polished semiconductor substrate, using the surface treatment composition set forth in claim 1.

* * * * *